(12) United States Patent
Caveney et al.

(10) Patent No.: US 7,520,784 B2
(45) Date of Patent: Apr. 21, 2009

(54) ELECTRICAL CONNECTOR WITH IMPROVED CROSSTALK COMPENSATION

(75) Inventors: Jack E. Caveney, Hinsdale, IL (US); Masud Bolouri-Saransar, Orland Park, IL (US)

(73) Assignee: Panduit Corp., Tinley Park, IL (US)

( * ) Notice: Subject to any disclaimer, the term of this patent is extended or adjusted under 35 U.S.C. 154(b) by 0 days.

(21) Appl. No.: 12/135,569

(22) Filed: Jun. 9, 2008

(65) Prior Publication Data
US 2008/0242156 A1 Oct. 2, 2008

Related U.S. Application Data

(63) Continuation of application No. 11/693,256, filed on Mar. 29, 2007, now Pat. No. 7,384,315, which is a continuation of application No. 11/464,335, filed on Aug. 14, 2006, now Pat. No. 7,309,261, which is a continuation of application No. 11/099,110, filed on Apr. 5, 2005, now Pat. No. 7,153,168.

(60) Provisional application No. 60/559,846, filed on Apr. 6, 2004.

(51) Int. Cl.
*H01R 24/00* (2006.01)
(52) U.S. Cl. .................. 439/676; 439/620.19
(58) Field of Classification Search .................. 439/79, 439/676, 620.11–620.23, 941
See application file for complete search history.

(56) References Cited

U.S. PATENT DOCUMENTS

| | | | | |
|---|---|---|---|---|
| 5,163,836 A * | 11/1992 | Young et al. | ................... | 439/67 |
| 5,186,647 A * | 2/1993 | Denkmann et al. | ........... | 439/395 |
| 5,228,872 A * | 7/1993 | Liu | ............................. | 439/607 |
| 5,299,956 A * | 4/1994 | Brownell et al. | ............. | 439/638 |
| 5,503,572 A * | 4/1996 | White et al. | ................. | 439/676 |
| 5,586,914 A * | 12/1996 | Foster et al. | ................. | 439/676 |
| 5,716,237 A * | 2/1998 | Conorich et al. | ............ | 439/660 |
| 5,766,034 A * | 6/1998 | Block et al. | ................. | 439/553 |
| 5,779,503 A * | 7/1998 | Tremblay et al. | ........... | 439/676 |
| 5,791,943 A * | 8/1998 | Lo et al. | ...................... | 439/676 |
| 5,797,764 A * | 8/1998 | Coulombe et al. | ............ | 439/55 |
| 5,885,111 A * | 3/1999 | Yu | ............................... | 439/676 |
| 5,915,989 A * | 6/1999 | Adriaenssens et al. | ....... | 439/404 |
| 5,997,358 A * | 12/1999 | Adriaenssens et al. | ....... | 439/676 |
| 6,017,229 A * | 1/2000 | Tulley et al. | ................. | 439/144 |
| 6,017,247 A * | 1/2000 | Gwiazdowski | .............. | 439/676 |
| 6,057,743 A * | 5/2000 | Aekins | ........................... | 333/1 |
| 6,079,996 A * | 6/2000 | Arnett | ......................... | 439/188 |
| 6,120,330 A * | 9/2000 | Gwiazdowski | .............. | 439/676 |
| 6,155,881 A * | 12/2000 | Arnett et al. | ................. | 439/676 |
| 6,168,474 B1 * | 1/2001 | German et al. | .............. | 439/676 |
| 6,176,742 B1 * | 1/2001 | Arnett et al. | ........... | 439/620.23 |
| 6,196,880 B1 * | 3/2001 | Goodrich et al. | ............ | 439/676 |
| 6,231,397 B1 * | 5/2001 | de la Borbolla et al. | ...... | 439/676 |

(Continued)

*Primary Examiner*—Khiem Nguyen
(74) *Attorney, Agent, or Firm*—Robert A. McCann; Zachary J. Smolinski; Christopher K. Marlow

(57) ABSTRACT

An electrical connector with improved crosstalk compensation is disclosed. By including at least one coupling with a different frequency dependency than other couplings in the connector, crosstalk compensation performance is improved over a greater frequency range. The different frequency dependency may, for example, be used to compensate for phase shifts caused by distances between compensation circuitry and the plug/jack interface. Embodiments for decreasing these distances are also disclosed.

7 Claims, 38 Drawing Sheets

U.S. PATENT DOCUMENTS

| | | | |
|---|---|---|---|
| 6,238,235 B1* | 5/2001 | Shavit et al. | 439/418 |
| 6,255,593 B1* | 7/2001 | Reede | 174/110 R |
| 6,267,617 B1* | 7/2001 | Nozick | 439/417 |
| 6,305,950 B1* | 10/2001 | Doorhy | 439/76.1 |
| 6,319,069 B1* | 11/2001 | Gwiazdowski | 439/676 |
| 6,332,810 B1* | 12/2001 | Bareel | 439/676 |
| 6,338,655 B1* | 1/2002 | Masse et al. | 439/638 |
| 6,356,162 B1* | 3/2002 | DeFlandre et al. | 333/4 |
| 6,371,793 B1* | 4/2002 | Doorhy et al. | 439/404 |
| 6,379,157 B1* | 4/2002 | Curry et al. | 439/676 |
| 6,379,175 B1* | 4/2002 | Reede | 439/418 |
| 6,402,560 B1* | 6/2002 | Lin | 439/676 |
| 6,409,547 B1* | 6/2002 | Reede | 439/676 |
| 6,410,845 B2* | 6/2002 | Reede | 174/27 |
| 6,464,529 B1* | 10/2002 | Jensen et al. | 439/405 |
| 6,464,541 B1* | 10/2002 | Hashim et al. | 439/676 |
| 6,524,139 B1* | 2/2003 | Chang | 439/676 |
| 6,533,618 B1* | 3/2003 | Aekins | 439/676 |
| 6,554,638 B1* | 4/2003 | Hess et al. | 439/490 |
| 6,736,681 B2* | 5/2004 | Arnett | 439/676 |
| 6,769,937 B1* | 8/2004 | Roberts | 439/676 |
| 6,780,035 B2* | 8/2004 | Bohbot | 439/188 |
| 6,802,743 B2* | 10/2004 | Aekins et al. | 439/676 |
| 2001/0014563 A1* | 8/2001 | Morita et al. | 439/941 |
| 2002/0019172 A1* | 2/2002 | Forbes et al. | 439/676 |
| 2002/0197043 A1* | 12/2002 | Hwang | 385/134 |
| 2003/0171024 A1* | 9/2003 | Mossner et al. | 439/404 |
| 2003/0194908 A1* | 10/2003 | Brown et al. | 439/620 |
| 2004/0184247 A1* | 9/2004 | Adriaenssens et al. | 361/766 |
| 2004/0248468 A1* | 12/2004 | Gurovich et al. | 439/620 |
| 2005/0014420 A1* | 1/2005 | Quenneville et al. | 439/719 |
| 2005/0136747 A1* | 6/2005 | Caveney et al. | 439/676 |
| 2005/0181676 A1* | 8/2005 | Caveney et al. | 439/676 |
| 2005/0202697 A1* | 9/2005 | Caveney et al. | 439/77 |
| 2005/0207561 A1* | 9/2005 | Hammond, Jr. | 379/351 |
| 2005/0208838 A1* | 9/2005 | Horowitz et al. | 439/676 |
| 2006/0014410 A1* | 1/2006 | Caveney | 439/188 |

* cited by examiner

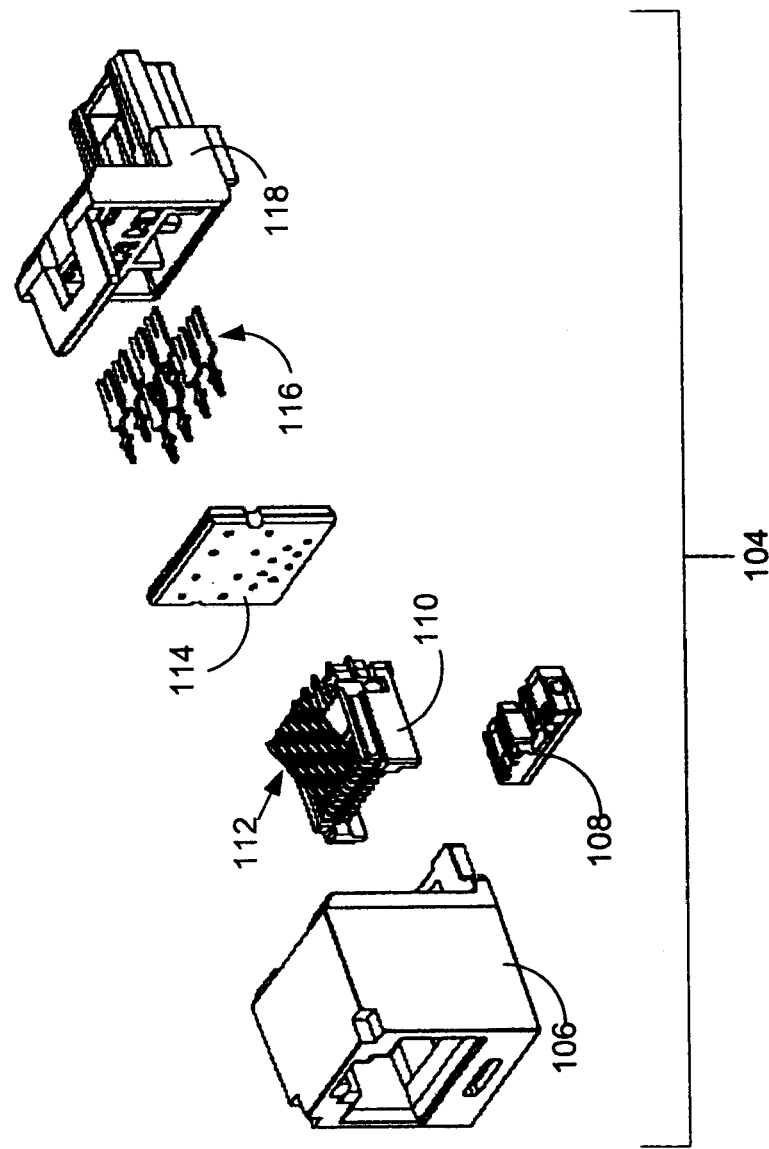
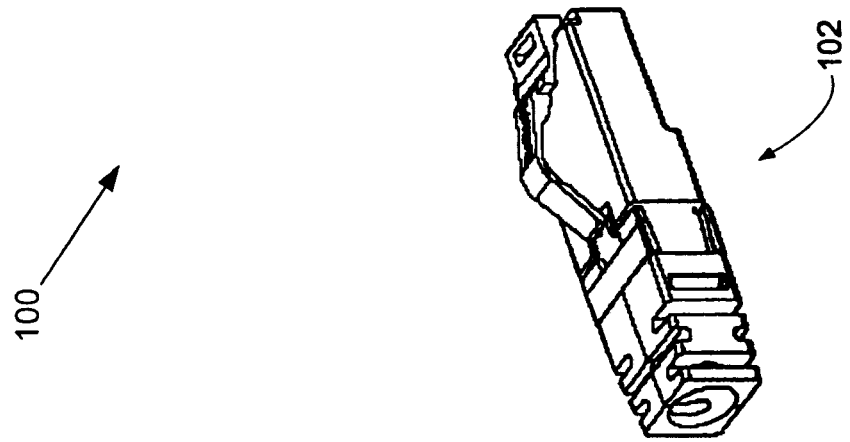
Fig. 1

Low Frequency

Medium Frequency

High Frequency

Low Frequency

Medium Frequency

High Frequency

Low Frequency

Medium Frequency

High Frequency

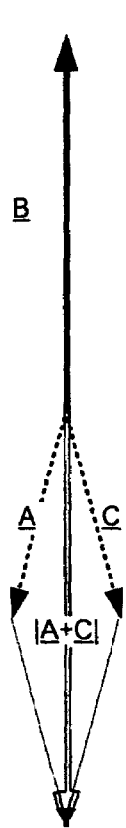
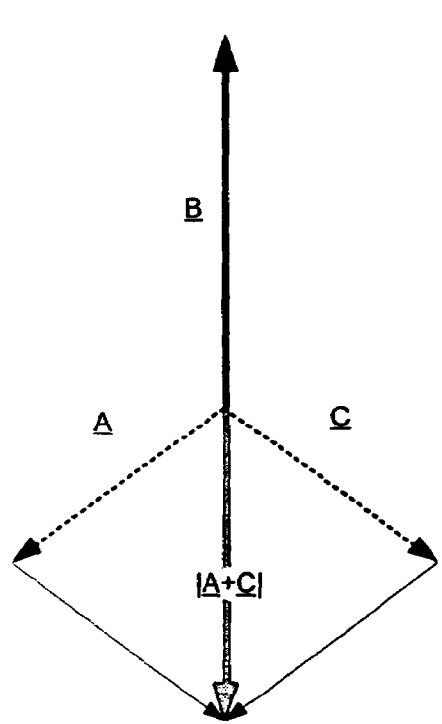
Fig. 10A  Low Frequency
Fig. 10B  Medium Frequency
Fig. 10C  High Frequency

ELECTRICAL CONNECTOR WITH IMPROVED CROSSTALK COMPENSATION

CROSS-REFERENCE TO RELATED APPLICATION

This application is a continuation of U.S. application Ser. No. 11/693,256, filed on Mar. 29, 2007 which is a continuation of U.S. application Ser. No. 11/464,335, filed on Aug. 14, 2006, now U.S. Pat. No. 7,309,261, which is a continuation of U.S. application Ser. No. 11/099,110, filed on Apr. 5, 2005, now U.S. Pat. No. 7,153,168, which claims priority to U.S. application Ser. No. 60/559,846, filed on Apr. 6, 2004. All of the previous applications are herein incorporated by reference in their entireties.

FIELD OF THE INVENTION

The present invention relates generally to electrical connectors, and more particularly, to a modular communication jack design with crosstalk compensation that is less susceptible to propagation delay effects at high frequencies.

BACKGROUND OF THE INVENTION

In the communications industry, as data transmission rates have steadily increased, crosstalk due to capacitive and inductive couplings among the closely spaced parallel conductors within the jack and/or plug has become increasingly problematic. Modular connectors with improved crosstalk performance have been designed to meet the increasingly demanding standards. Many of these improved connectors have included concepts disclosed in U.S. Pat. No. 5,997,358, the entirety of which is incorporated by reference herein. In particular, recent connectors have introduced predetermined amounts of crosstalk compensation to cancel offending near end crosstalk (NEXT). Two or more stages of compensation are used to account for phase shifts from propagation delay resulting from the distance between the compensation zone and the plug/jack interface. As a result, the magnitude and phase of the offending crosstalk is offset by the compensation, which, in aggregate, has an equal magnitude, but opposite phase.

Recent transmission rates, including those in excess of 500 MHz, have exceeded the capabilities of the techniques disclosed in the '358 patent. Thus, improved compensation techniques are needed.

BRIEF DESCRIPTION OF THE FIGURES

FIG. 1 is an exploded perspective view of a communications connector, including a plug and jack;

FIGS. 10A-10C are schematic vector polar diagrams illustrating the effect on |A+C| relative to |B| as frequency increases, for a communications connector employing an embodiment of the invention;

DETAILED DESCRIPTION OF THE PREFERRED EMBODIMENTS

Figure 2:
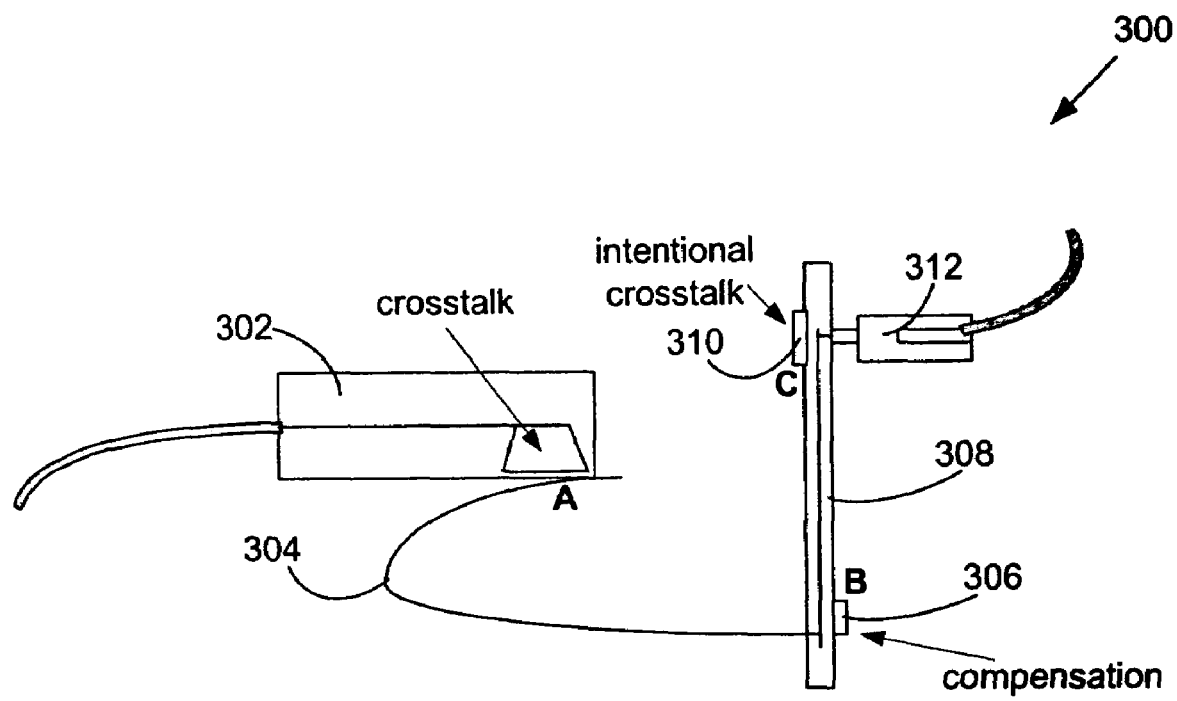
FIG. 2 is a simplified schematic diagram illustrating parts of a connector assembly that are primarily responsible for causing and compensating for near end crosstalk.

FIG. 1 is an exploded perspective illustration of a communication connector 100 comprising a plug 102 and a jack 104, into which the plug 102 may be inserted. The plug 102 terminates a length of twisted pair communication cable (not shown), while the jack 104 may be connected to another piece of twisted pair communication cable or punch-down block (neither of which is shown in FIG. 1)

As shown from left to right, the jack 104 includes a main housing 106 and a bottom front sled 108 and top front sled 110 arranged to support eight plug interface contacts 112. The plug interface contacts 112 engage a PCB (Printed Circuit Board) 114 from the front via through-holes in the PCB 114. As illustrated, eight IDCs (Insulation Displacement Contacts) 116 engage the PCB 114 from the rear via additional through-holes in the PCB 114. A rear housing 118 having passageways for the IDCs 116 serves to provide an interface to a twisted pair communication cable or punch-down block. The general connector 100 illustrated in FIG. 1 serves as background for the following discussion of improvements that may be made to the connector 100 to improve crosstalk performance.

The simplified schematic diagram of FIG. 2 conceptually illustrates parts of a connector assembly 300 that are primarily responsible for causing near end crosstalk, as well as those that may be used to compensate for near end crosstalk. The plug 302 and plug interface contacts 304 contribute respective capacitive and inductive crosstalk components $C_{plug}+L_{plug}$ and $C_{contacts}+L_{contacts}$, which may be approximated as a lumped crosstalk vector A (see FIG. 4). A compensation zone 306 on the PCB 308 provides crosstalk compensation to produce compensation vector B. To account for the phase shift of B with respect to A that will occur due to propagation delay, a near end crosstalk zone 310 (shown opposite the PCB 308 from IDCs 312) may contribute some additional crosstalk C to reduce the phase shift's effect on combined crosstalk.

Figure 3:
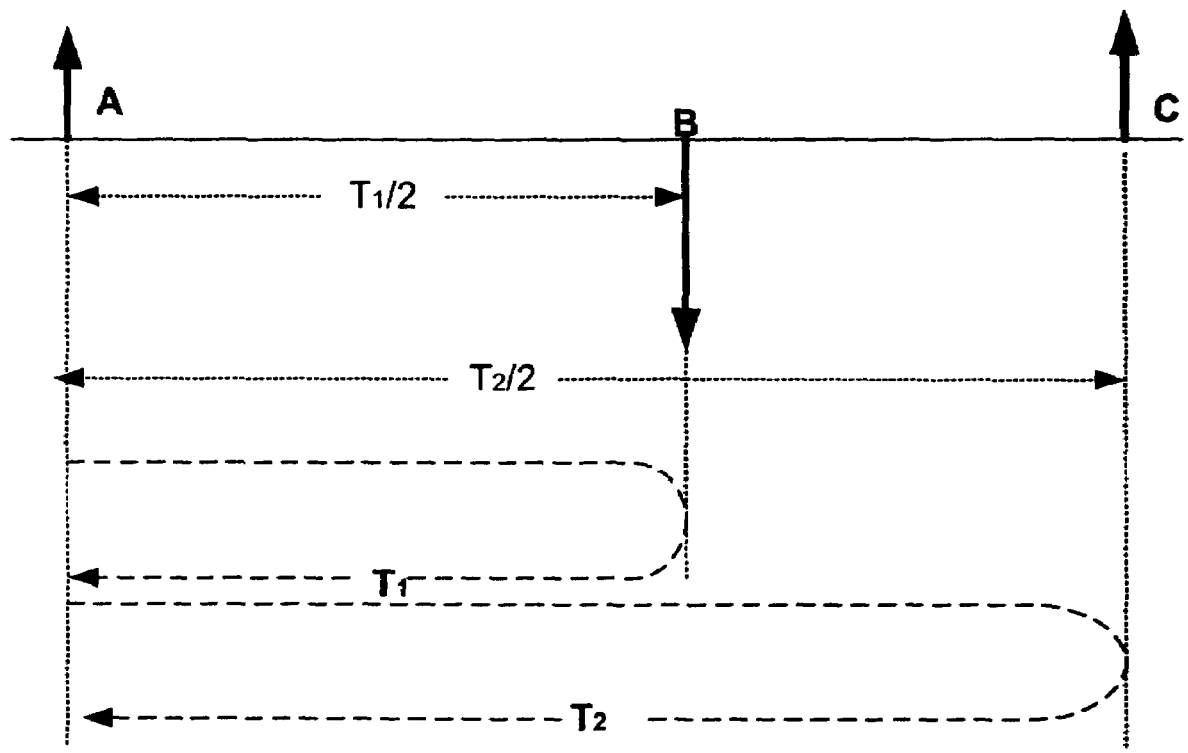
FIG. 3 is a schematic vector diagram illustrating vectors A, B, and C on a time axis.

FIG. 3 illustrates vectors A, B, and C on a time axis. Note that the crosstalk vectors A and C are opposite in polarity from compensation vector B. The vectors' relative displacement along the time axis is caused by the physical distance of the compensation zone 306 and the crosstalk zone 310 from where the plug 302 meets the plug interface contacts 304 (causing propagation delays $T_1$ and $T_2$) and the relative permittivity of the intervening conduction paths.

Figure 4:
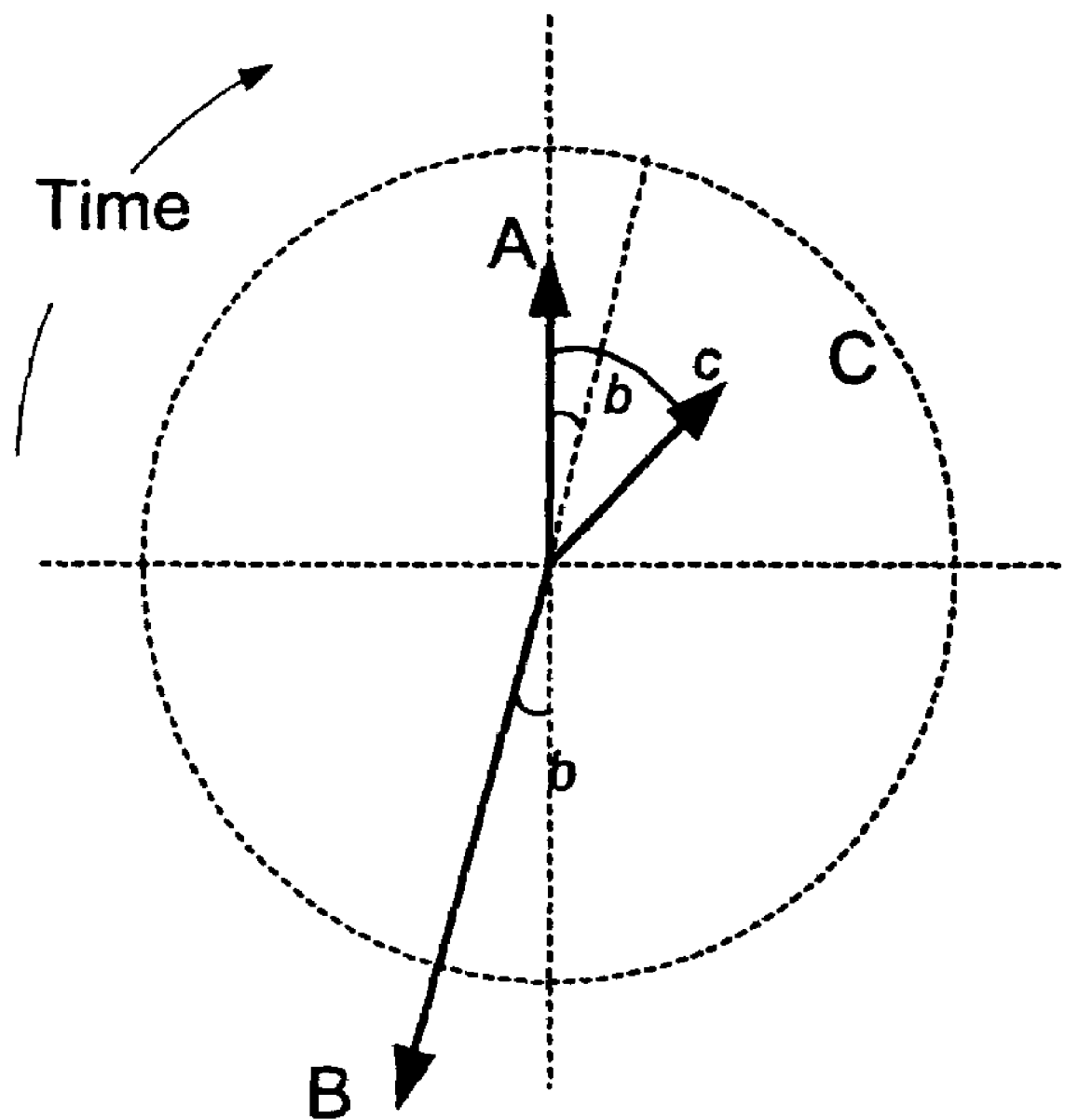
FIG. 4 is a schematic vector diagram illustrating magnitude and phase components for vectors A, B, and C on a polar axis, with reference to crosstalk vector A.

FIG. 4 illustrates vectors A, B, and C on a polar axis, wherein displacement along the time axis of FIG. 3 has been translated to phase shift with reference to crosstalk vector A. As frequency increases, the phase shift of B will grow toward A and that of C will grow in opposition to A. For relatively small phase shifts, combined crosstalk can be minimized by designing the compensation zone and crosstalk zone so that |B+C| is approximately equal to |A| at a desired null frequency.

Figure 5:
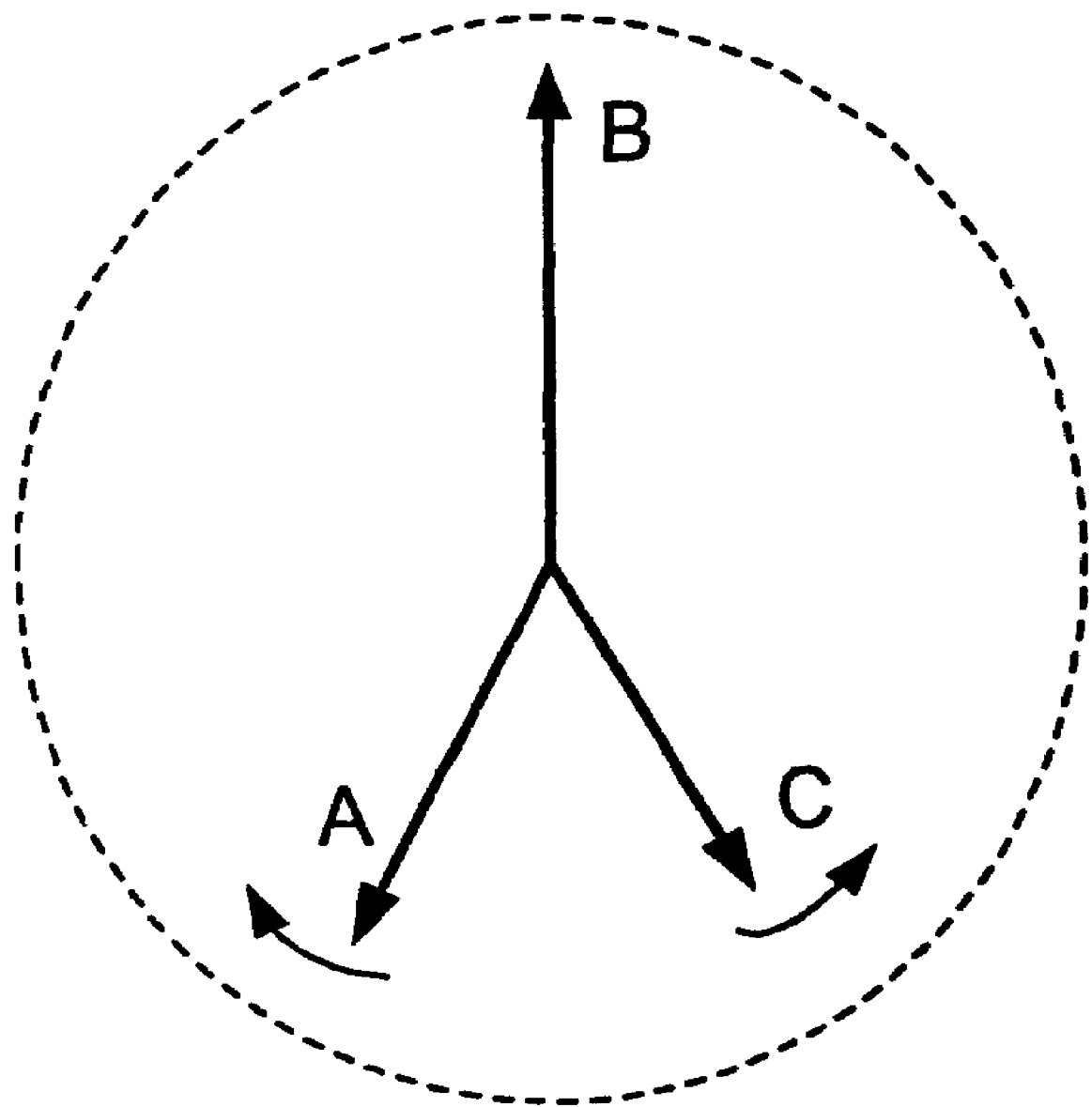
FIG. 5 is a schematic vector diagram illustrating vectors A, B, and C on a polar axis, with reference to compensation vector B.
Figure 6A:
FIGS. 6A-6C are schematic vector polar diagrams illustrating the effect on |A+C| relative to |B| as frequency increases for a typical communications connector.
Figure 6B:
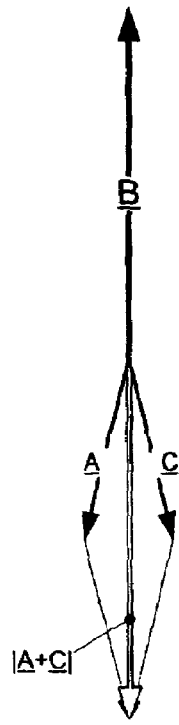
Figure 6C:
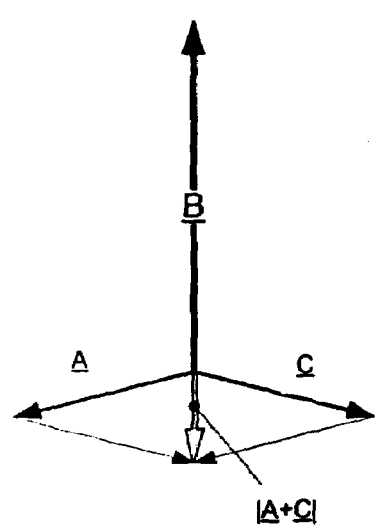

For frequencies up to about 300 MHz, the multi-zone crosstalk compensation technique illustrated in FIGS. 2-4 is suitable to comply with Cat. 6 (TIA-568B) requirements for near end crosstalk. At higher frequencies, however, this technique is unsatisfactory. To illustrate, FIG. 5 shows vectors A, B, and C on a polar axis, but with reference to compensation vector B. To minimize combined crosstalk, |B| should be selected to be close to |A+C|. However, as frequency increases, A and C experience larger phase shifts, evidenced by larger angles from vertical on the polar axis of FIG. 5. Because the cosines of these increasing angles will decrease, |A+C| will become considerably less than |B|, resulting in unsatisfactory connector performance. This effect is illustrated in FIGS. 6A-6C, where |A+C| becomes relatively smaller than |B| as frequency increases.

Figure 7:
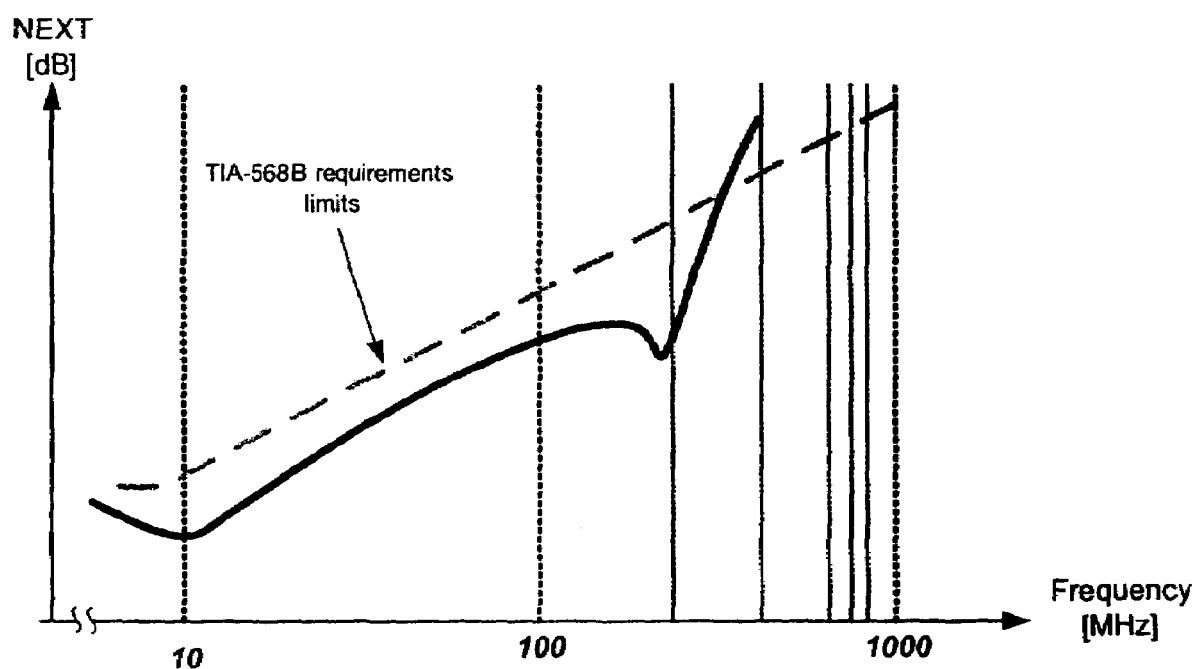
FIG. 7 is a graph of near end crosstalk versus frequency, illustrating crosstalk performance of a typical Cat. 6 communications connector in relation to TIA-568B requirements.

FIG. 7 shows combined crosstalk performance of a typical Cat. 6 connector using the technique discussed with reference to FIGS. 2-6. Note the frequency at which the NEXT crosses the TIA-568B requirements limit.

To improve the NEXT performance to be suitable beyond the frequencies that are feasible with the above technique, an additional coupling having a magnitude that grows disproportionate to frequency relative to a typical coupling may be included in the connector. Alternatively, one of the existing couplings can be modified to have a magnitude that varies disproportionally relative to the other couplings. Past typical connector couplings have been capacitive or mutually inductive, resulting in a magnitude that is proportional to frequency (approximately 20 dB per decade). The relative magnitudes of these typical connector couplings have remained approximately the same throughout various frequencies. By introducing a coupling that grows disproportionally relative to other couplings, the compensation for phase shifts caused by propagation delay (see FIGS. 2-6C, above) will retard the growth of the combined crosstalk through higher frequencies.

FIGS. 8A-15 and their accompanying descriptions show alternative implementations of additional couplings having a magnitude that grows at a disproportionate rate relative to typical couplings, in response to frequency. Other implementations may also be used without departing from the spirit and scope of the present invention. FIGS. 8A-10C are vector diagrams showing desired coupling characteristics. The description of FIGS. 8A-10C is followed by a discussion of alternative methods for achieving the desired coupling characteristics.

Figure 8A:
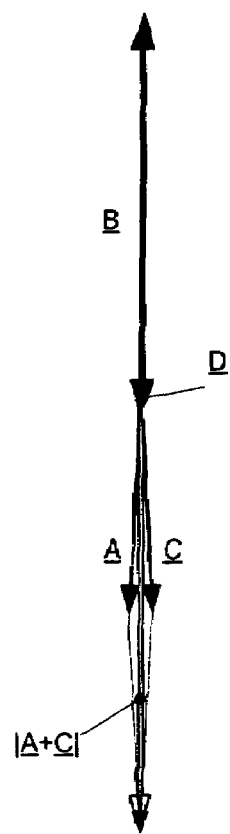
FIGS. 8A-8C are schematic vector polar diagrams illustrating the effect on |A+C+D| relative to |B| as frequency increases, for a communications connector employing an embodiment of the invention.
Figure 8B:
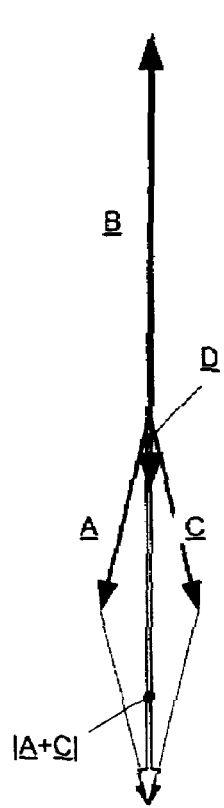
Figure 8C:
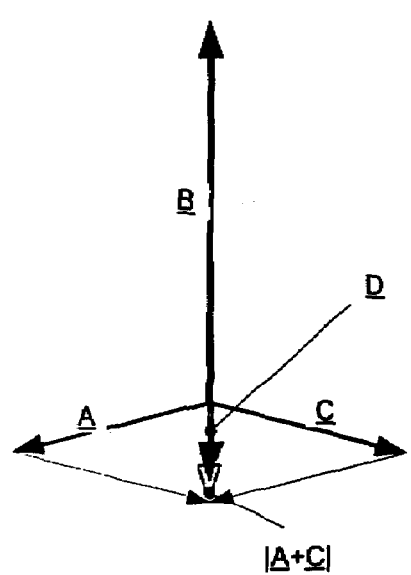

According to a first implementation, the additional coupling is a fourth coupling, D, having a magnitude with a frequency dependency that is different than that of A, B, and C. For example, at low frequencies, A, B, and C change at a rate of 20 dB per decade, while D could change at a lower rate, such as approximately 5 dB per decade. Then, at higher frequencies (such as those greater than a null frequency of interest), D could change at a higher rate (such as 30 dB per decade), while A, B, and C remain relatively constant at 20 dB per decade. By selecting |B|−|D| to be equal to |A|+|C| at the null frequency, the combined crosstalk is near zero at low frequency, as shown by FIG. 8A. FIG. 8B shows that as frequency increases, the phase angles of A and C increase, resulting in smaller vertical magnitude components to offset |B|. However, the more rapidly growing |D| increases to compensate for decreasing |A+C|. FIG. 8C illustrates this effect at an even higher relative frequency.

Figure 9A:
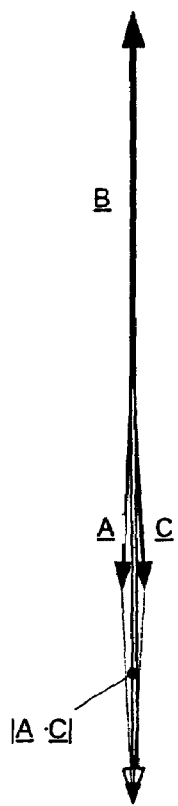
FIGS. 9A-9C are schematic vector polar diagrams illustrating the effect on |A+C| relative to |B| as frequency increases, for a communications connector employing an embodiment of the invention.
Figure 9B:
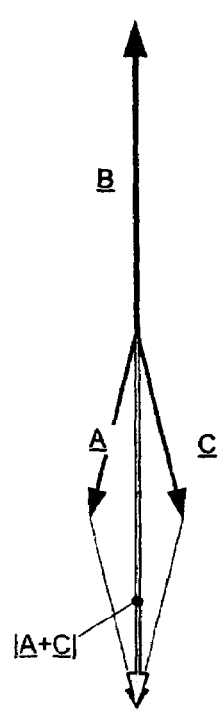
Figure 9C:
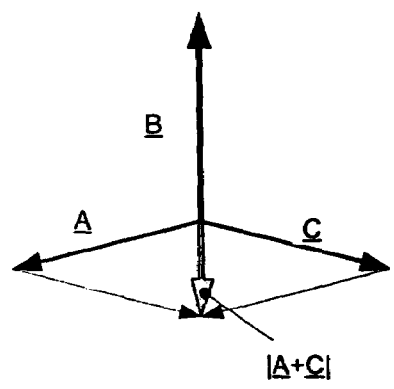

In a second implementation, illustrated in FIGS. 9A-9C, compensation zone vector B is designed to have a magnitude with a frequency dependency that differs from that of A and C. For example, at low frequencies, if A and C change at a rate of 20 dB per decade, then B could be selected to vary at a lower rate, such as 15 dB per decade. At higher frequencies (such as those greater than a null frequency of interest), B could negatively change at a higher rate (such as −30 dB per decade), while A, and C remain relatively constant at 20 dB per decade. In contrast to the first implementation illustrated in FIGS. 8A-8C, no additional coupling is needed in this second implementation. By selecting |B| to be close to |A|+|C| at the null frequency, the combined crosstalk is near zero at low frequency. As frequency increases, |A| and |C| will grow disproportionately faster than |B|, so that |B| will be close to |A+C| at increased frequencies (see FIGS. 9B and 9C).

In a third implementation, illustrated in FIGS. 10A-10C, couplings A and C are selected to have a greater magnitude dependence on frequency than B at frequencies higher than the null frequency. For example, at low frequencies, A, B, and C could all change at a rate of 20 dB per decade. At high frequencies, however, A and C could be selected to vary at a higher rate, such as 25 dB per decade, while B remains at approximately 20 dB per decade. By selecting |B| to be close to |A|+|C| at the null frequency of interest, the combined crosstalk is near zero at low frequency. Due to the higher frequency dependencies of |A| and |C|, the more rapidly growing |A| and |C| can compensate for the decreasing |A+C| that would normally occur with increased phase angles caused by high frequency operation. Thus, low combined crosstalk can be maintained over a wider frequency range, as shown in FIGS. 10A-10C. Of course, to vary A would likely require a change to the plug itself, which may be unacceptable in some cases. However, changing even C alone would provide some benefit.

The three implementations described above are merely examples of possible implementations. The relative rates of change in magnitude given in dB per decade may vary from one application to the next, depending on the specific construction and materials of the connector assembly. In addition, the concept of relative magnitude variation over frequency may be applied to improve performance at frequencies other than at or around the null frequency. The null frequency was chosen for the above examples because it serves as a good starting point for making adjustments to improve high frequency operation. For current communications applications, null frequencies are generally observed around 100-250 MHz. Different connector designs will likely exhibit different null frequencies.

In a preferred embodiment, the communication jack includes plug interface contacts for making electrical contact with the plug contacts in a plug, where the plug interface contacts and plug contacts introduce crosstalk to the connector. The crosstalk has an associated first frequency dependency based on a frequency of a communication signal being communicated. The jack has at least two crosstalk compensation zones, with at least one of the crosstalk compensation zones including a coupling having an associated second frequency dependency that substantially differs from the first frequency dependency associated with the plug interface contacts and plug contacts. The first frequency dependency is a magnitude change of approximately 20 dB per decade. The second frequency dependency is a magnitude that changes from approximately 0 dB per decade at a first frequency to approximately 20 dB per decade at a second frequency. In a second preferred embodiment, the second frequency dependency is a magnitude that changes from approximately 20 dB per decade at a first frequency to less than 20 dB per decade at a second frequency. Finally, in a third preferred embodiment, the second frequency dependency is a magnitude change of 20 dB per decade, and the first frequency dependency is a magnitude that changes from approximately 20 dB per decade at a first frequency to greater than 25 dB per decade at a second frequency.

The adjustments to magnitude dependency on frequency may be made using several alternative techniques. The following discussion sets forth five of these techniques; however, others may be used without departing from the spirit and scope of the present invention.

Figure 11A:
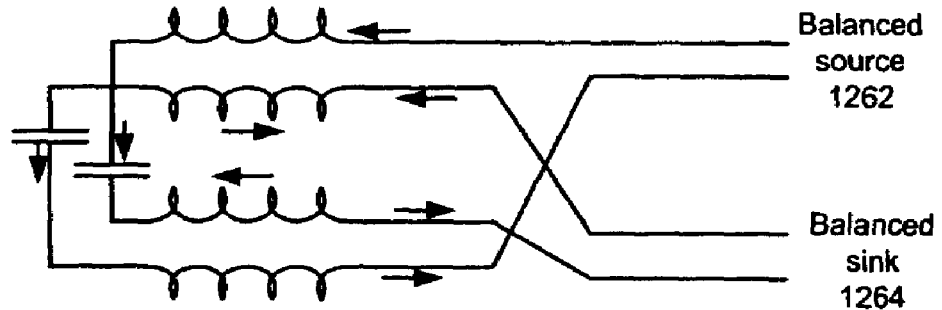
FIGS. 11A-11C are schematic diagrams, including equivalent circuit representations, illustrating a first embodiment of the invention.
Figure 11B:
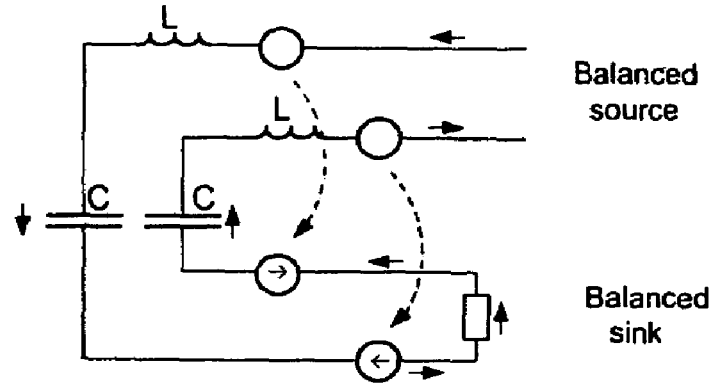
Figure 11C:
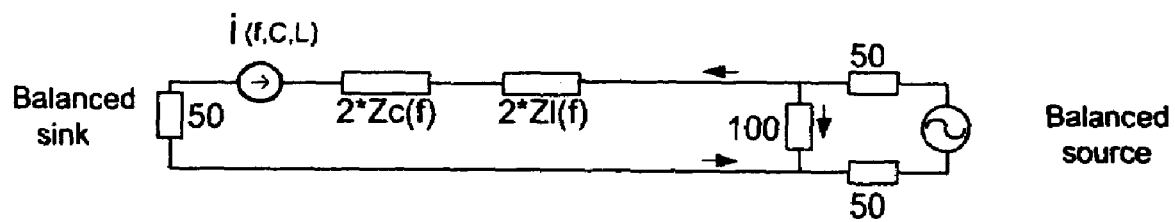
Figure 12:
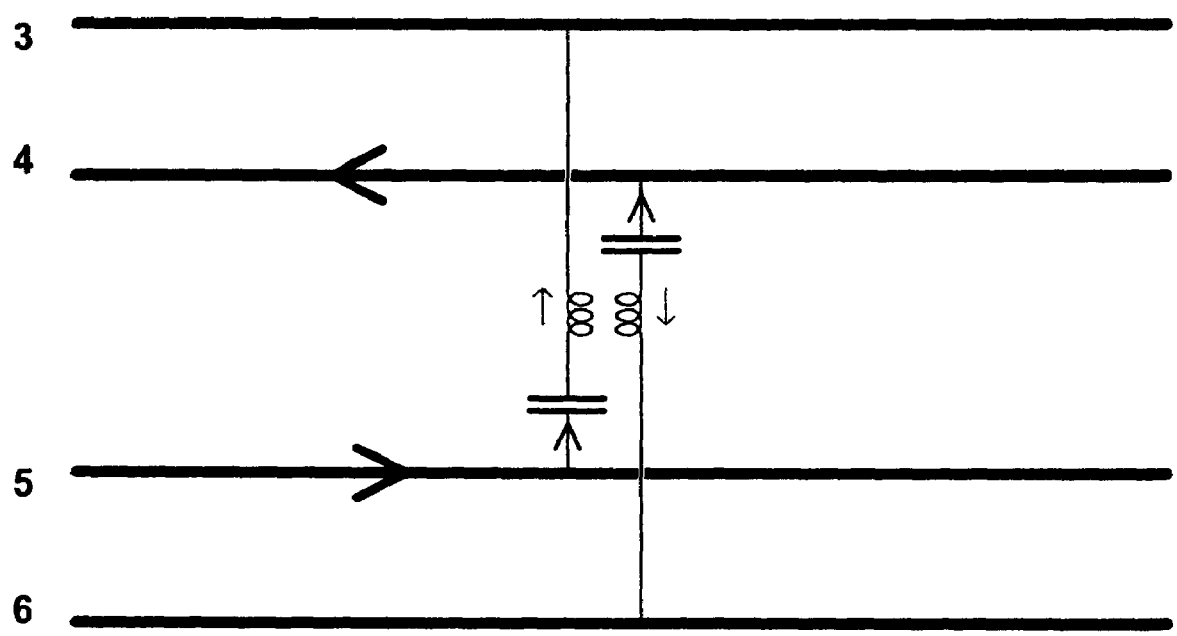
FIG. 12 is a schematic diagram illustrating an alternative implementation of the first embodiment shown in FIGS. 11A-11C.

Coupling alternative #1: FIGS. 11A-11C illustrate an example of a first embodiment, in which a capacitance is placed in series with a mutual-inductive coupling. The mutual inductive coupling generates a current in the reverse direction of the current flowing through the capacitor, as shown in FIG. 11A, self inductance equivalent circuit 11B, and impedance equivalent circuit 11C. At low frequencies, coupling through the capacitor is low; therefore, the reverse current generated in the secondary side of the inductance is also low. With rising frequency, coupling through the capacitor will rise, increasing the current through the primary side of the inductor, thereby causing a higher reverse current through the secondary side of the inductor. As a result, coupling declines proportionally to frequency. In a preferred embodiment, the "balanced source" 1262 shown in FIG. 11A is pairs 3 and 6, while the "balanced sink" 1264 is pairs 4 and 5. FIG. 12 shows an alternative arrangement of this embodiment, with pairs 3-4 and 5-6 illustrated on the left side.

Figure 13A:
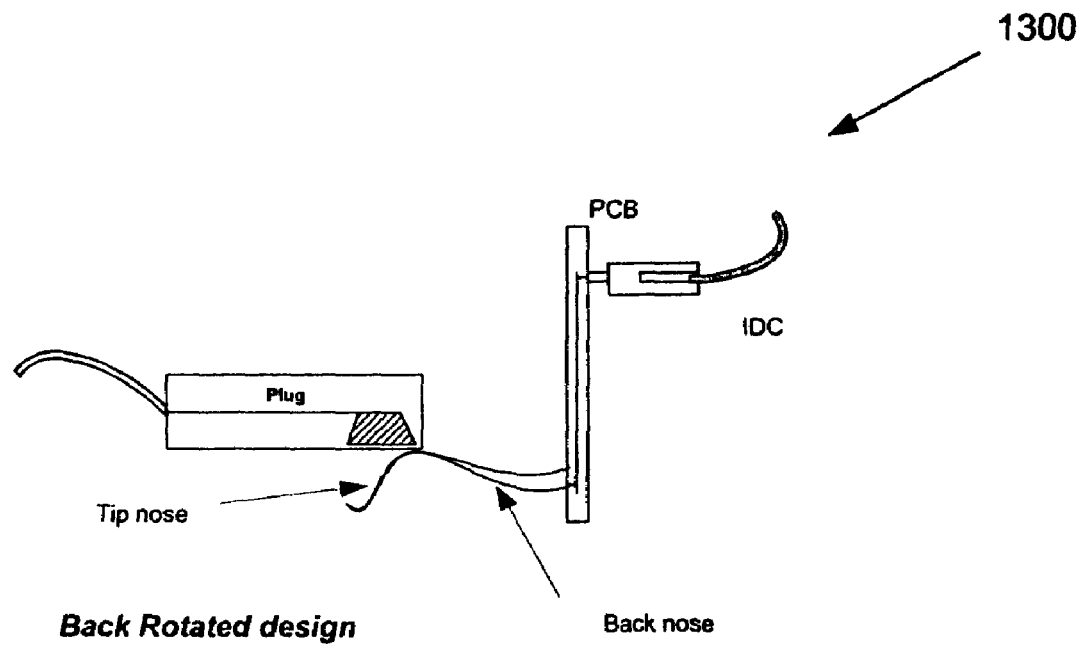
FIGS. 13A-13C are simplified schematic diagrams illustrating a back-rotated contact design, a front-rotated contact design, and a corresponding equivalent circuit representation illustrating an embodiment of the invention.
Figure 13B:
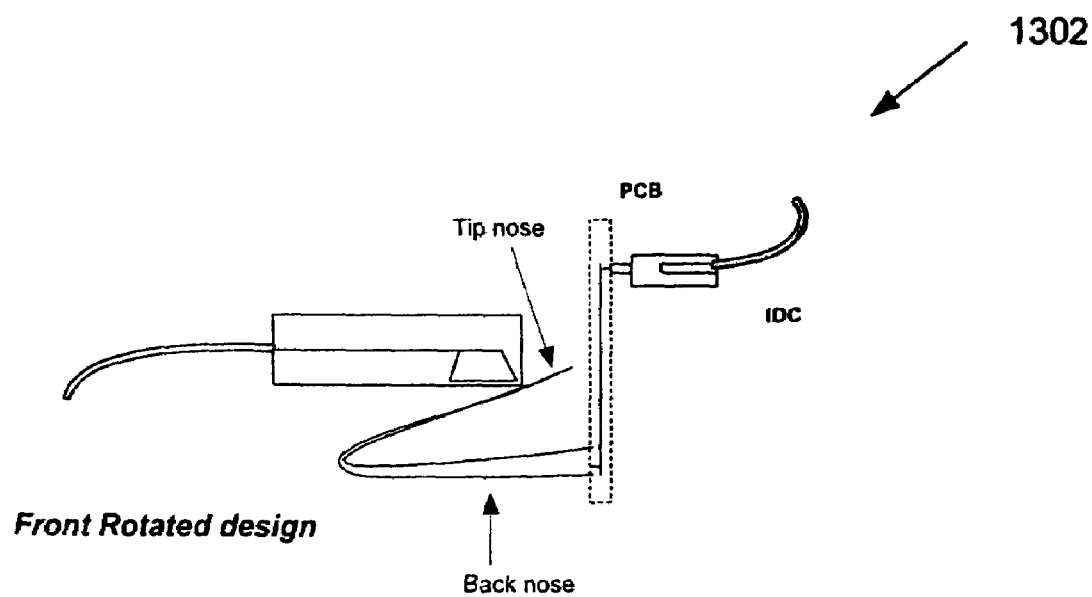
Figure 13C:
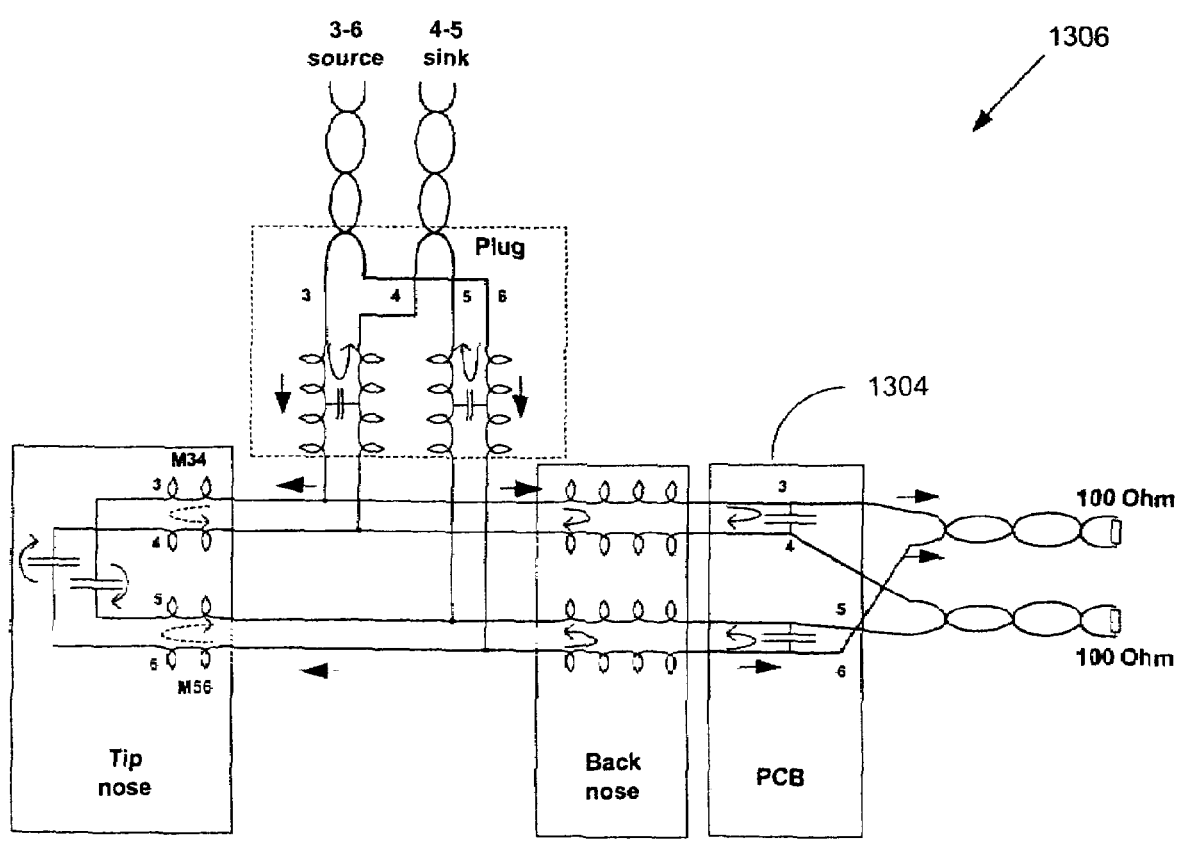

FIGS. 13A-13C illustrate how coupling alternative #1 may be implemented in either a back-rotated plug contact design 1300 or a front-rotated plug contact design 1302. An example showing the resulting couplings in the case where compensation capacitance is implemented on an interface PCB 1304 is illustrated in the simplified equivalent circuit 1306.

Figure 14A:
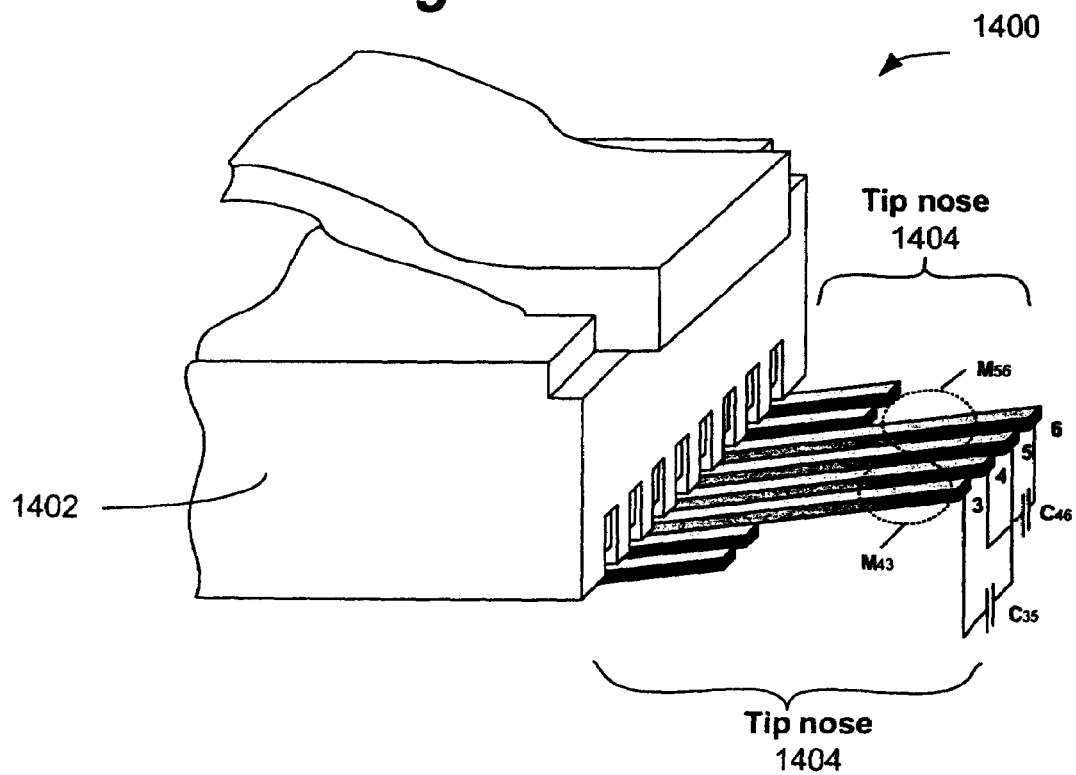
FIGS. 14A and 14B are partial perspective view diagrams illustrating front-rotated and back-rotated contact designs, respectively, in accordance with an embodiment of the invention.
Figure 14B:
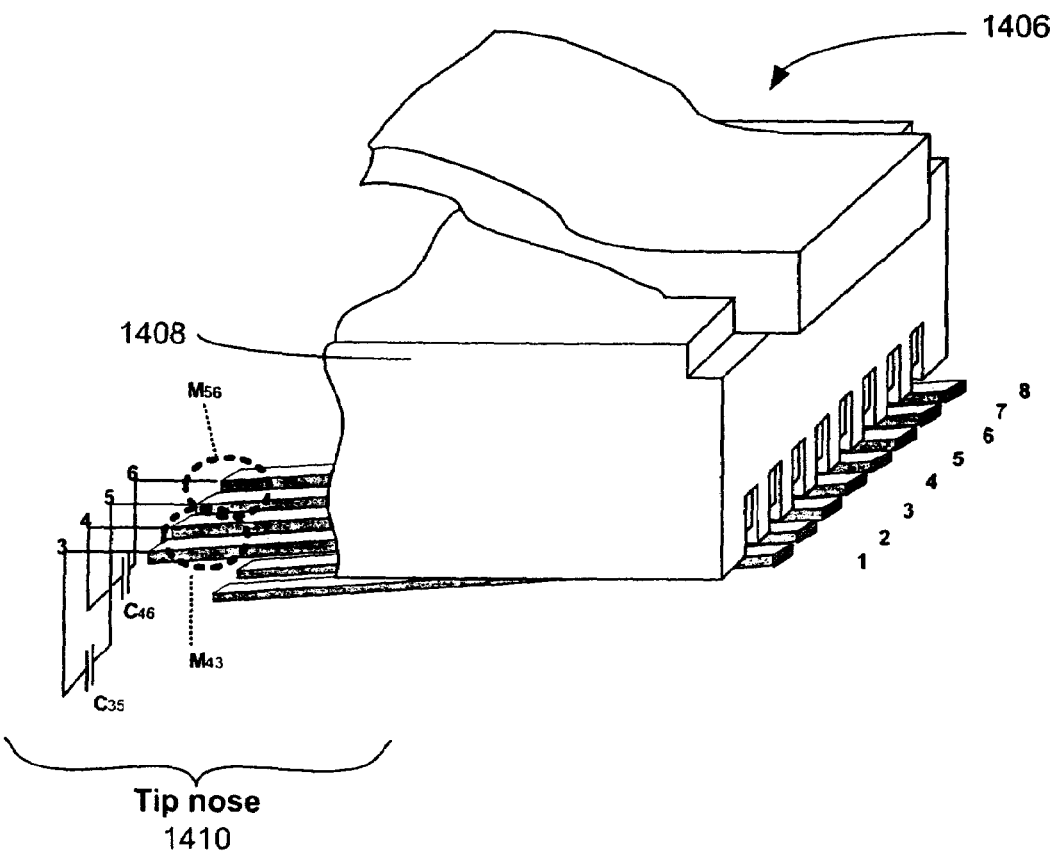

FIGS. 14A and 14B illustrate the location in a front-rotated design 1400 and a back-rotated design 1406 where the capacitive couplings may be located. In the front-rotated design 1400, the capacitance is placed in the tip nose region 1404 in a way that avoids physical interference with the plug 1402. In the back-rotated design 1406, the capacitance may again be located in the tip nose region 1410, which is on the opposite side of the plug 1408 when compared to the front-rotated design. For the back-rotated design 1406, the capacitance may be placed above or below the contacts of the tip nose region 1410, so long as it does not physically interfere with insertion of the plug 1408. The placements shown in FIGS. 14A and 14B result in capacitive couplings C35 and C46 (from pairs 3 and 5 and 4 and 6, respectively) and mutual inductive couplings M43 and M56 (from pairs 4 and 3 and 5 and 6, respectively).

Figure 14C:
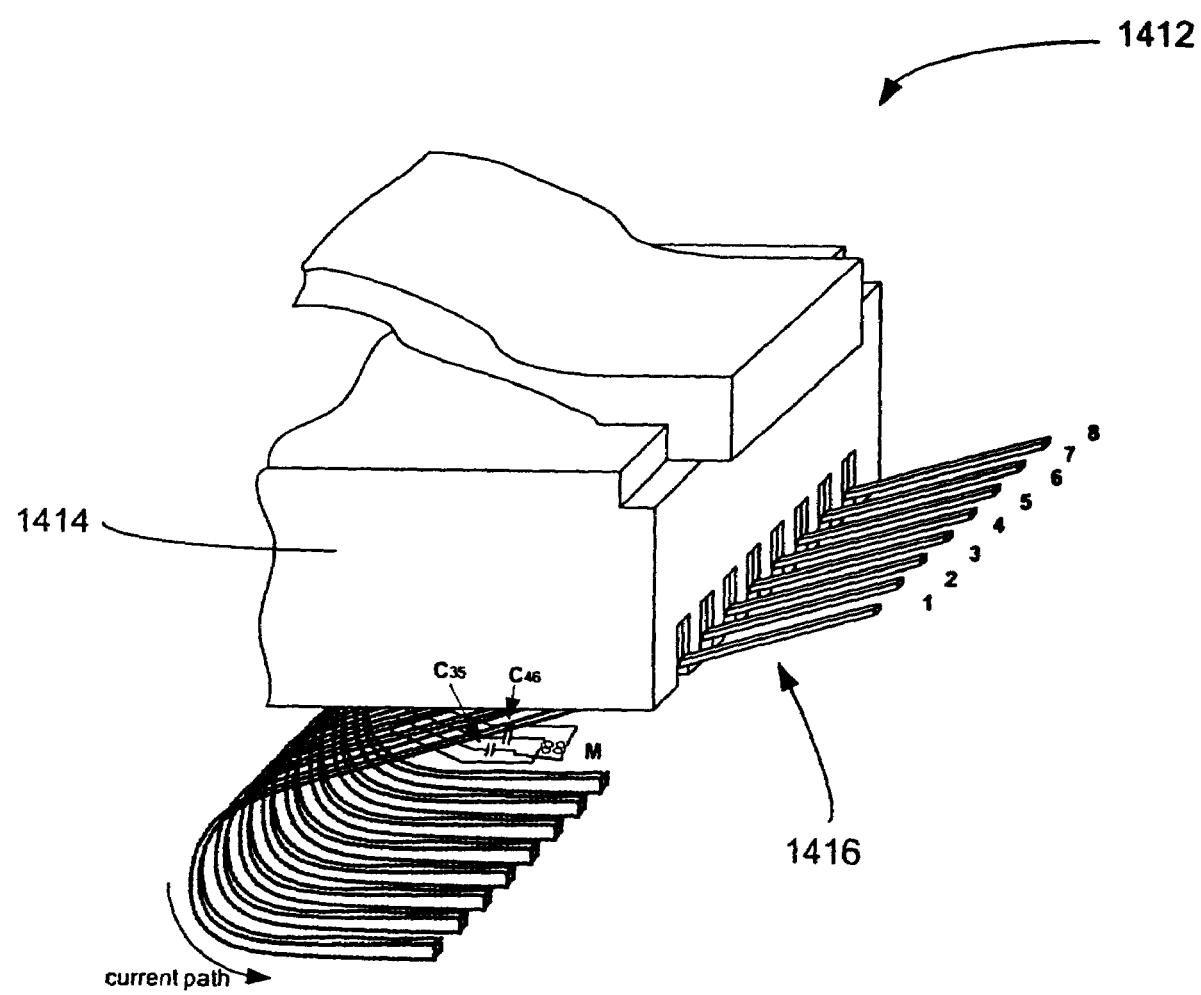
FIG. 14C is a partial perspective view diagram illustrating an alternative front-rotated design in accordance with an embodiment of the invention.

FIG. 14C illustrates another location in an alternative front-rotated design 1412, as schematically illustrated in FIG. 12, where the couplings may be located. In the alternative front-rotated design 1412, the couplings are placed even closer to the point of electrical contact between the plug 1414 and the plug interface contacts 1416. This closer placement results from locating the couplings on the opposite side of the plug interface contacts 1416 from the plug 1414. This is achieved by moving the inductive compensation from the conductors seen in the Tip Nose 1404 of FIG. 14A into a PCB, such as the flexible PCB shown in FIG. 24A. This results in reduced propagation delay and thus, reduced phase shift, which in turn provides better crosstalk performance.

Coupling alternative #2: In a second alternative, the coupling takes the form of a capacitance that varies with frequency relative to other couplings. One example of such a capacitance is a capacitor having a dielectric with a permittivity that changes with frequency.

Coupling alternative #3: According to a third alternative, the coupling is mutually inductive with a relative frequency-dependent inductance. One example of such an inductance is an inductive element composed of a ferrite material. Ferrites (e.g. compounds with iron oxide and nickel-zinc or manganese-zinc) typically exhibit permeabilities that vary greatly as a function of frequency starting at frequencies of around 100 kHz to 1 GHz. For example, a mixture of iron oxide and nickel-zinc has an initial permeability ranging from 10 to 1,500 over a range of 1 MHz to 1 GHz.

Coupling alternative #4: In a fourth alternative, the coupling is a capacitance in series with one or more resistors that are frequency-dependent. For example, a conductor or semiconductor resistor can be constructed to take advantage of the skin-effect to increase resistance at high frequencies.

Coupling alternative #5: According to a fifth alternative, a capacitance is placed in series with a self-inductive coupling. Increased inductance at higher frequencies will result in less coupling through the capacitance.

Figure 15:
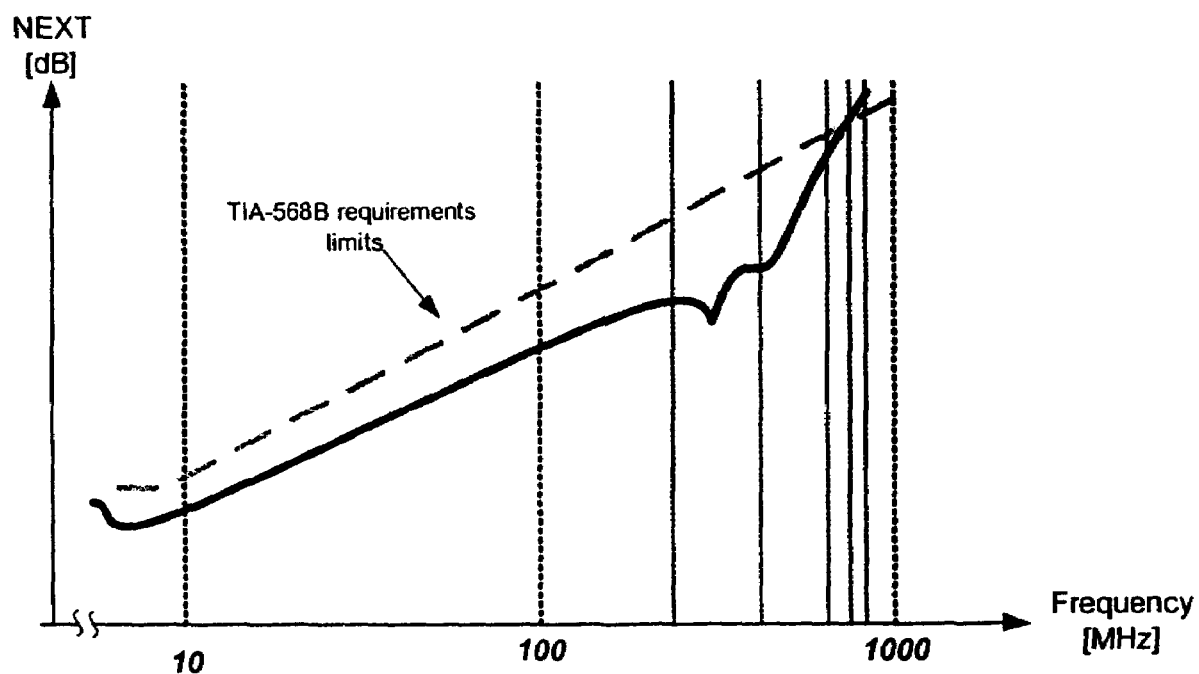
FIG. 15 a graph of near end crosstalk versus frequency, illustrating crosstalk performance of a communications connector according to an embodiment of the invention, in relation to TIA-568B requirements.

FIG. 15 shows improved combined crosstalk performance of a typical Cat. 6 connector that may be obtained using the inventive techniques discussed above with reference to FIGS. 8A-14. Note that the frequency at which the NEXT crosses the TIA-568B requirements limit is much higher than in FIG. 7.

The high frequency effects described with reference to FIGS. 2-7, and the need to implement the above solutions to achieve acceptable high-frequency operation, arise primarily from the physical distance between the plug interface contacts and first compensation. By decreasing this distance, better performance (i.e. less phase shift due to propagation delay) may be attained at high frequencies. For example, moving the first compensation point to a point less than approximately 0.200 inches from the plug/jack interface provides better crosstalk performance. FIGS. 16-28 illustrate physical changes that may be made to a jack to shorten the distance between the plug interface contacts and first compensation. These changes may be made in lieu of, or in combination with, the techniques described above. Optimal crosstalk performance will result from implementing the combination.

Figure 16:
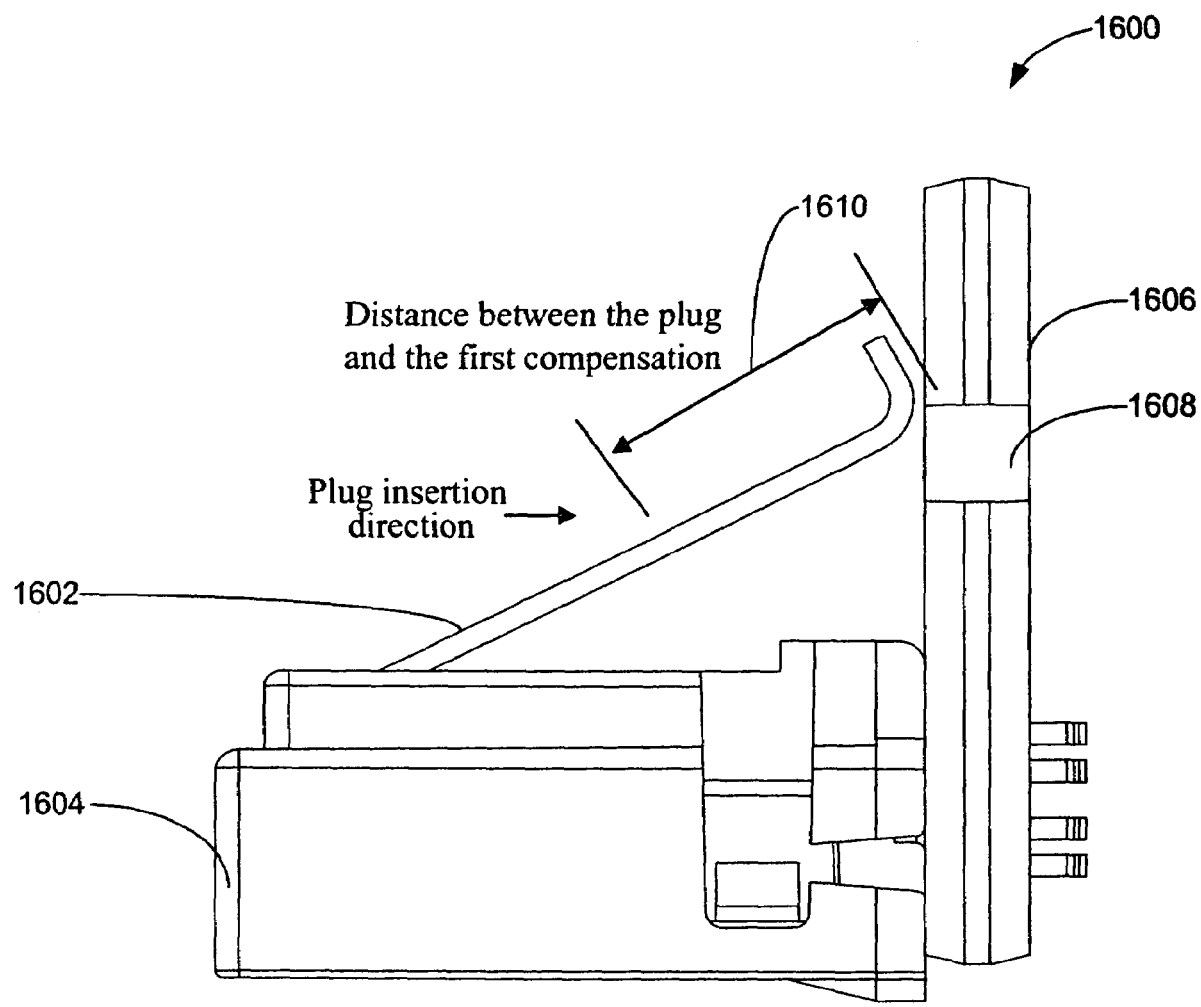
FIG. 16 is a right-side view illustrating a front-rotated contact configuration in a communications jack, in accordance with an embodiment of the invention.
Figure 17:
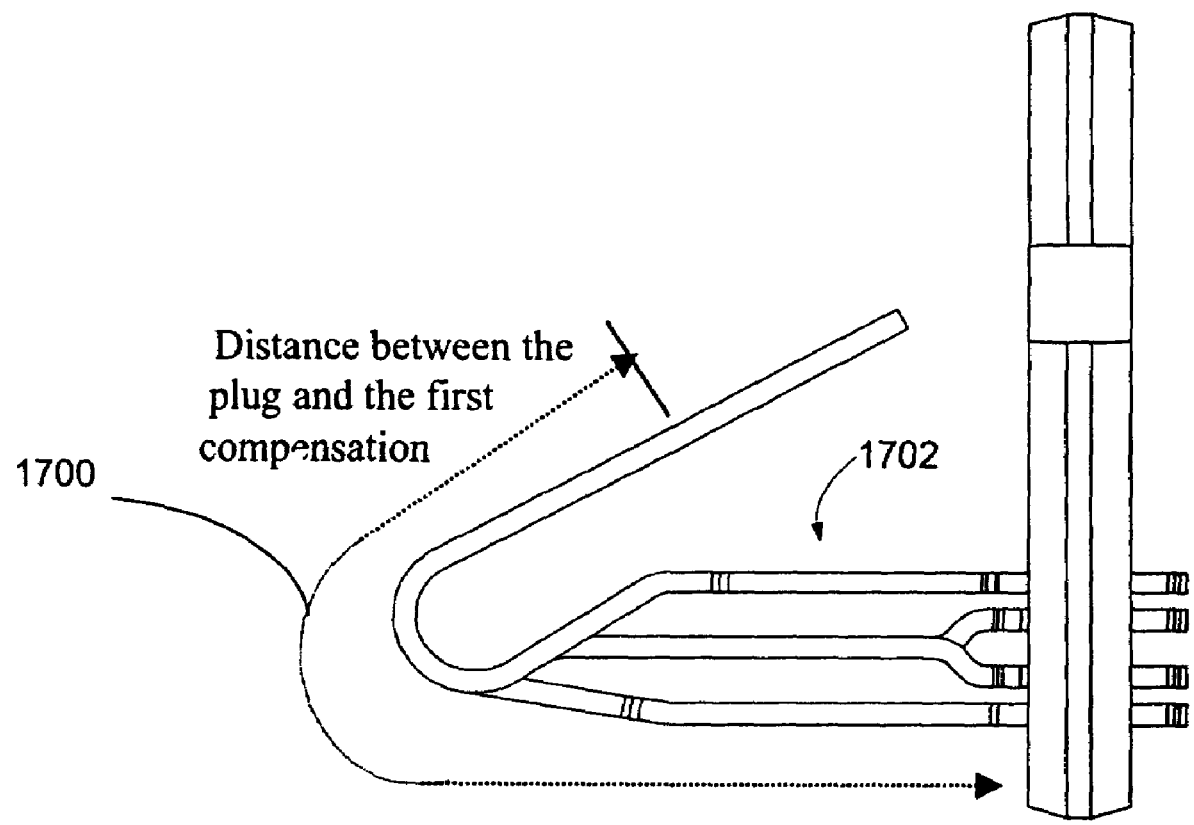
FIG. 17 is a right-side view illustrating a front-rotated contact configuration in a communications jack, in accordance with another embodiment of the invention.

FIG. 16 is a right-side schematic diagram illustrating a front rotated contact configuration 1600, including a plurality of plug interface contacts 1602 disposed in a contact carrier and front sled 1604 and a vertical interface PCB 1606 having a contact portion 1608 connected to a crosstalk compensation zone (not shown). Compared to typical plug interface contacts, the plug interface contacts 1602 are longer so that they come into contact with the contact portion 1608 of the vertical interface PCB 1606. As a result, the distance 1610 between the contact portion 1608 and the point at which contact is made between an inserted plug and the plug interface contacts 1602 is significantly smaller than for typical plug interface contacts, as can be seen by comparing the distance 1610 to distance 1700 in FIG. 17. Because the improved design has a shorter distance between the plug contact and the first compensation, propagation delay is lessened, resulting in a smaller phase shift. This, in turn, enables better crosstalk compensation and operation at higher frequencies than would be possible without such a design. It should be noted that FIG. 17 includes inductive couplings shown generally at 1702, which assist in crosstalk compensation.

Figure 18:
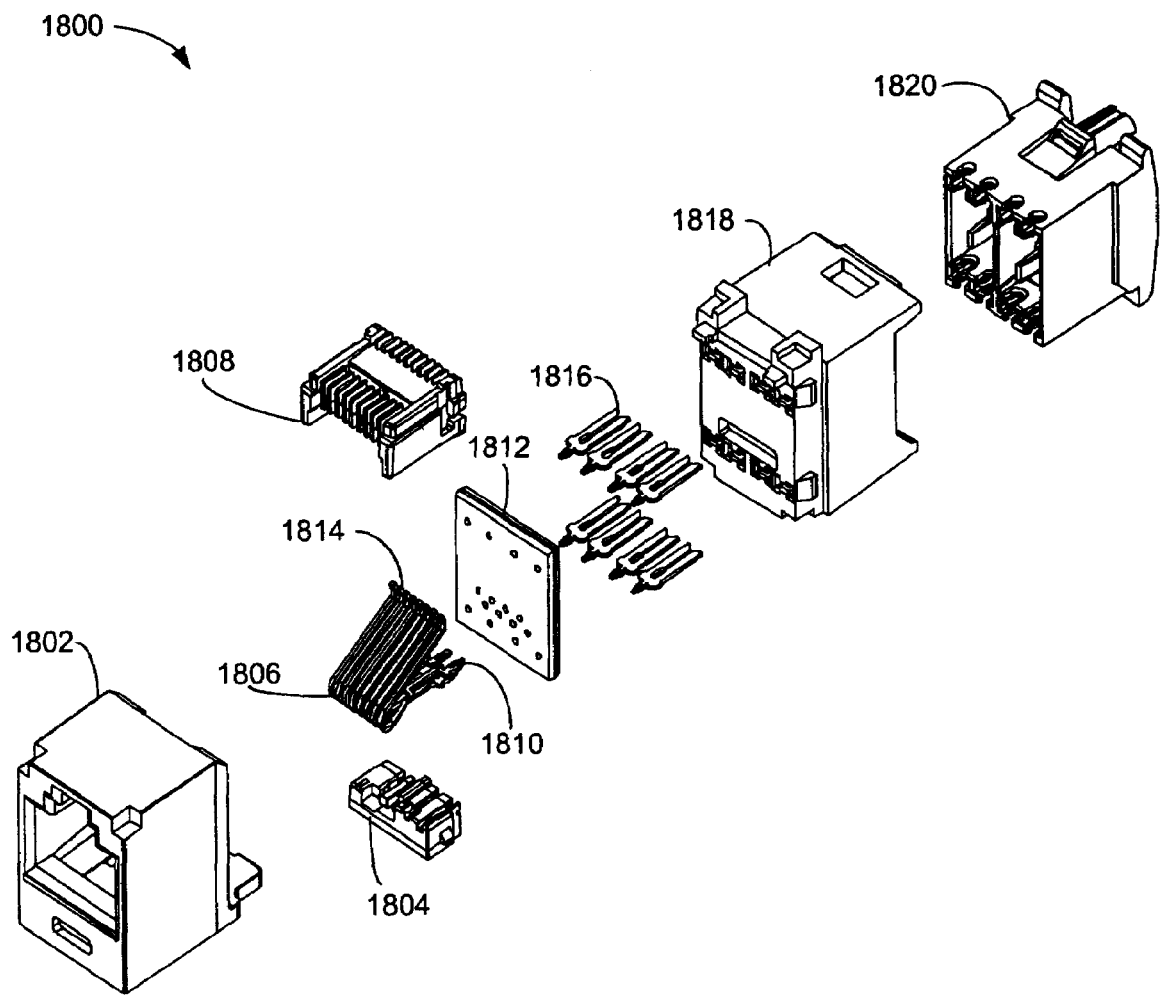
FIG. 18 is an upper right-side exploded perspective view of a connector jack in accordance with an embodiment of the present invention.

FIG. 18 is an upper right-side exploded perspective view of a connector jack 1800 employing the above concept. The jack 1800 includes a bottom front sled 1804 and a top front sled 1808, each mechanically attached to a plurality of plug interface contacts 1806. A first end 1810 of the plug interface contacts 1806 may be inserted into through-holes in an interface PCB 1812, while a second end 1814 includes plug interface contact ends that are longer than for a typical jack to allow contact with a compensation zone on the interface PCB 1812. The sub-assembly comprising the bottom front sled 1804, plug interface contacts 1806, top front sled 1808, and interface PCB 1812 is then inserted into a housing 1802. Also to be inserted into through-holes on the interface PCB 1812 are a plurality of IDCs 1816. A rear sled 1820 is snapped into the housing 1802. A wire containment cap 1818 is configured to accept a four-pair twisted-pair communication cable for connection to the IDCs 1816 through the rear sled 1820. The wire containment cap 1818 may then be snapped onto the rear sled 1820, forming an integrated communication jack assembly.

While the above technique uses an alternative conductor path between the plug interface contacts and the first compensation, a second technique consists of placing the first compensation zone closer to the plug contact point by attaching a flexible PCB to the plug interface contacts. As an example, pad capacitors could be etched onto the flexible PCB to provide capacitive crosstalk compensation, thereby improving the electrical performance of the jack.

Figure 19:
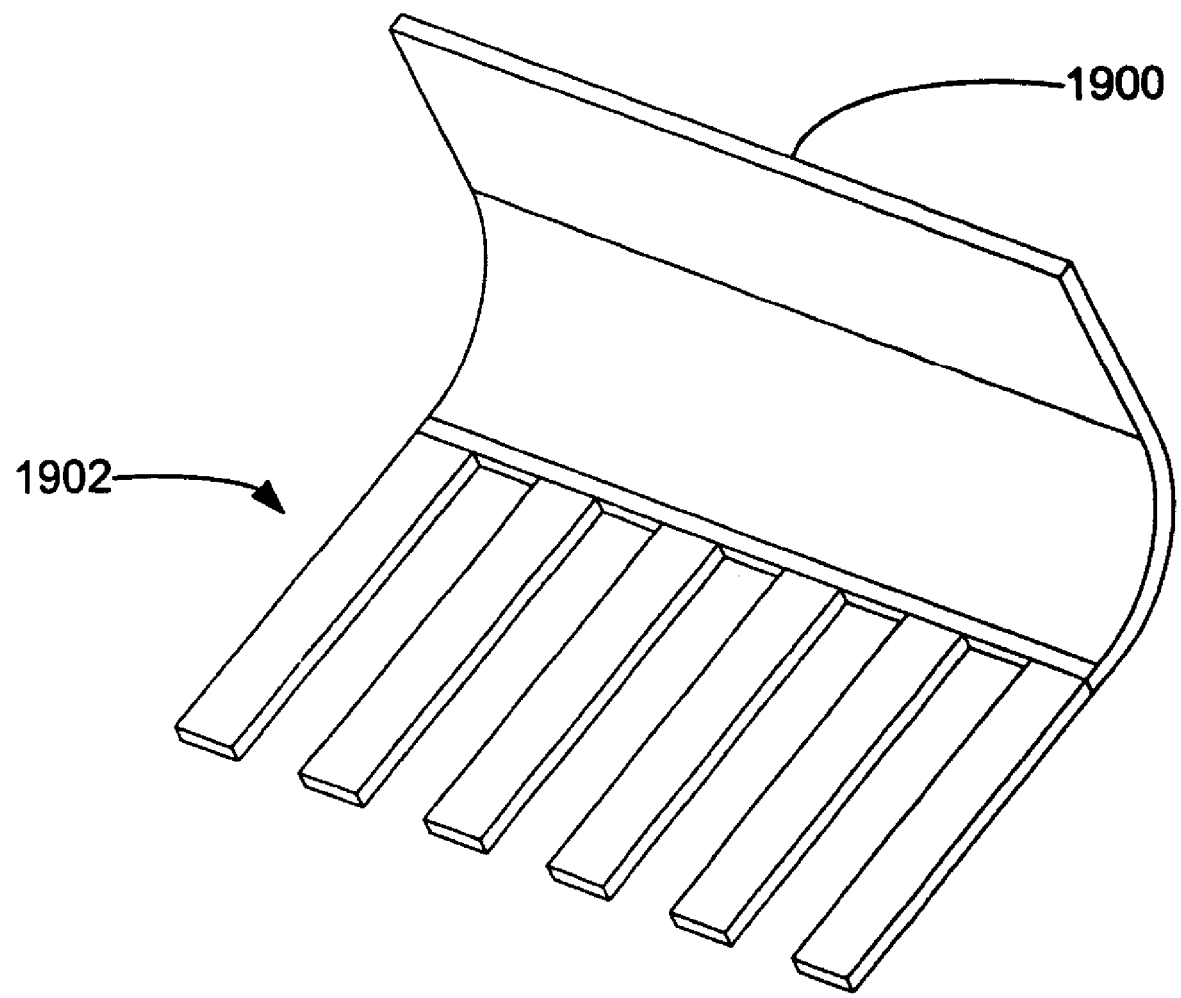
FIG. 19 is an upper right-side perspective view of a six-position flexible PCB in accordance with an embodiment of the invention.
Figure 20:
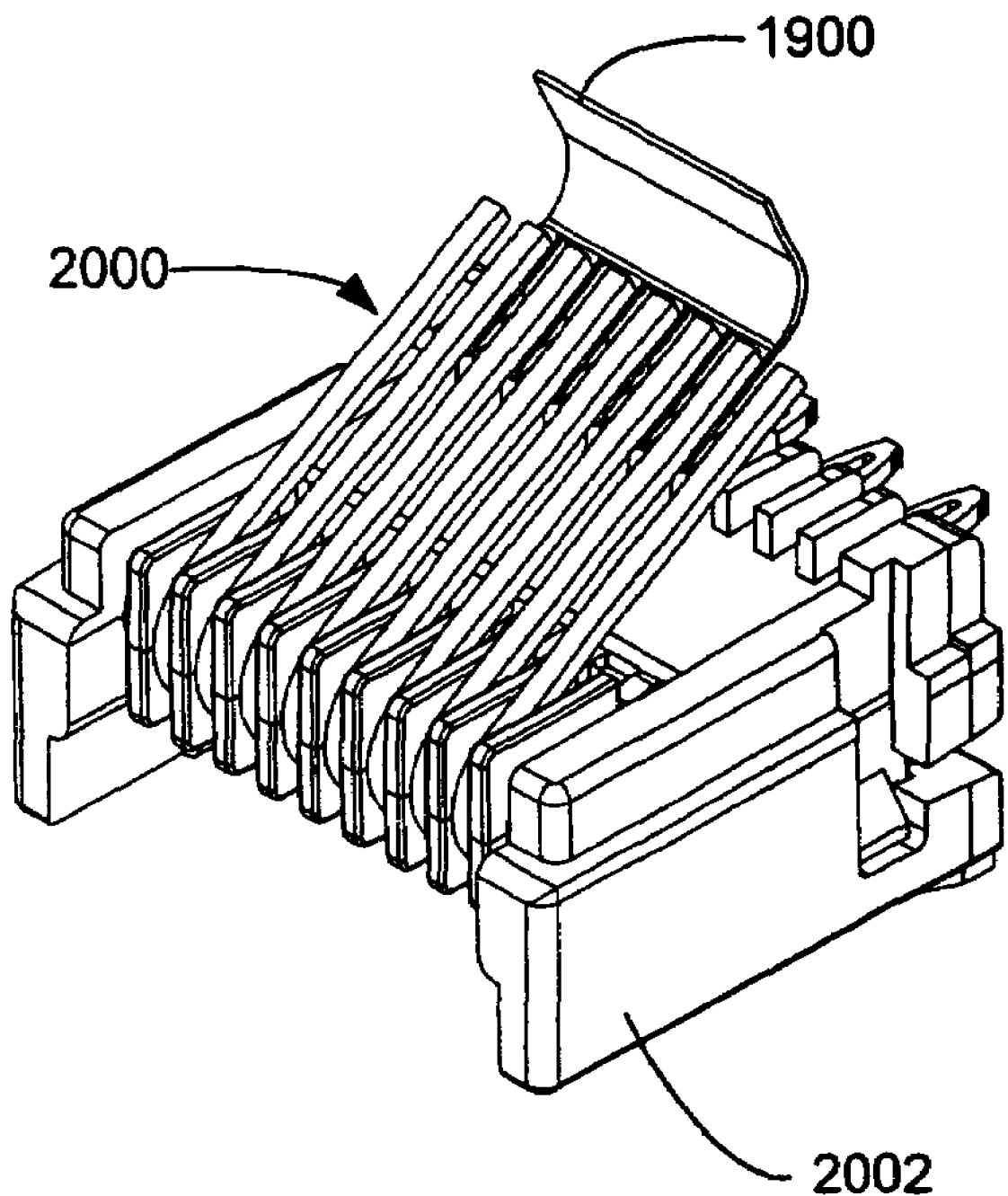
FIG. 20 is an upper right-side perspective view of a front sled with plug interface contacts and an upward-folded flexible PCB in accordance with an embodiment of the invention.

FIG. 19 shows a six-position flexible PCB 1900 having six fingers 1902 that may be used to attach the flexible PCB 1900 to plug interface contacts 2000 carried in a front sled 2002, as shown in FIG. 20. While a six-position flexible PCB 1900 is shown, an eight-position implementation is also possible. A six-position design may be preferred to avoid damage to standard RJ-45 jacks when a six-position RJ-45 plug is inserted. A standard six-position RJ-45 plug has plastic that protrudes further than the six contacts, which may lead to excessive displacement of plug interface contacts in the jack. The six-position flexible PCB 1900 allows plug interface contacts 1 and 8 to be displaced further than plug interface contacts 2 though 7. The flexible PCB 1900 is preferably constructed of a layer of copper adhered to a polyester or polyamide substrate. The copper can be removed (e.g. by etching) in various configurations to create a crosstalk compensation zone. The fingers 1902 of the flexible PCB 1900 may be attached to the plug interface contacts 2000 in any of a number of ways. Attachment techniques may include ultrasonically welding or heat soldering, for example.

Figure 21:
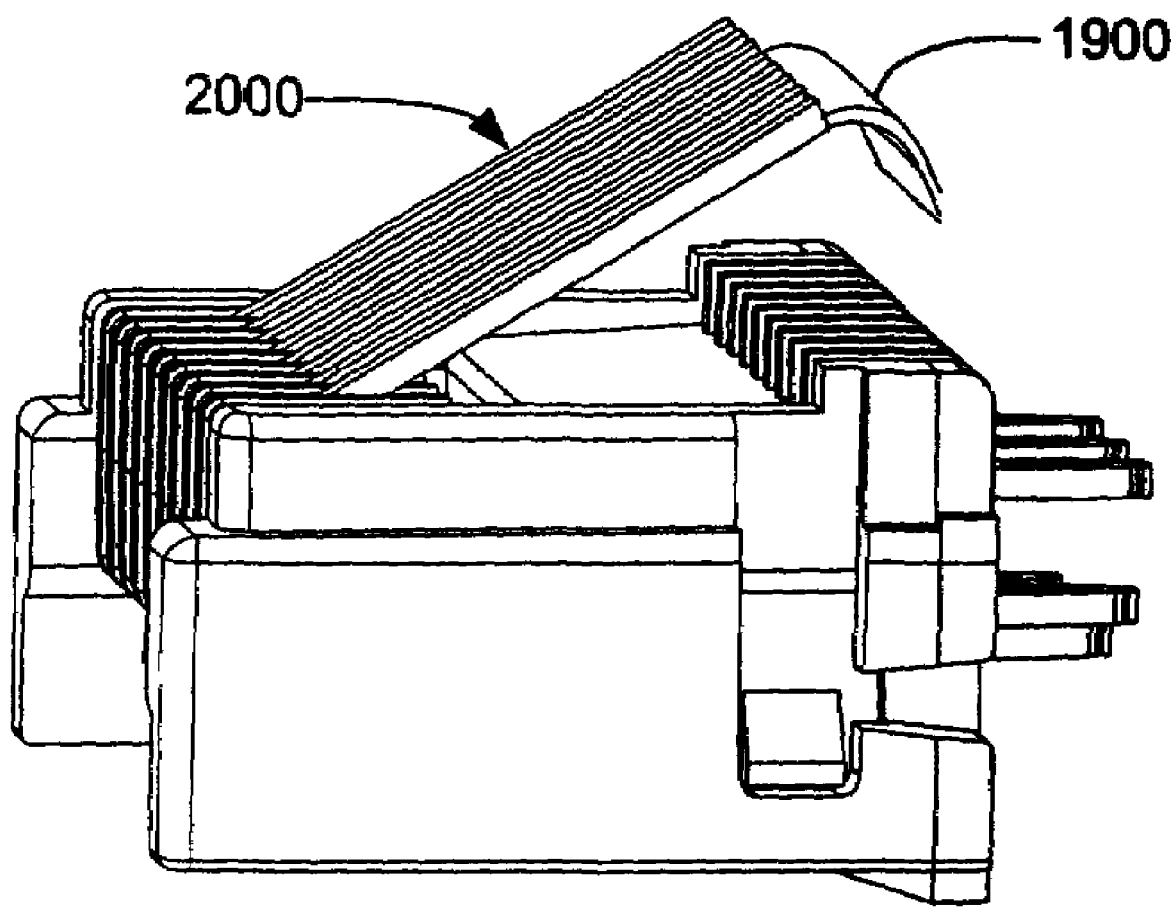
FIG. 21 is an upper right-side perspective view of a front sled with plug interface contacts and a downward-folded flexible PCB in accordance with an embodiment of the invention.
Figure 22:
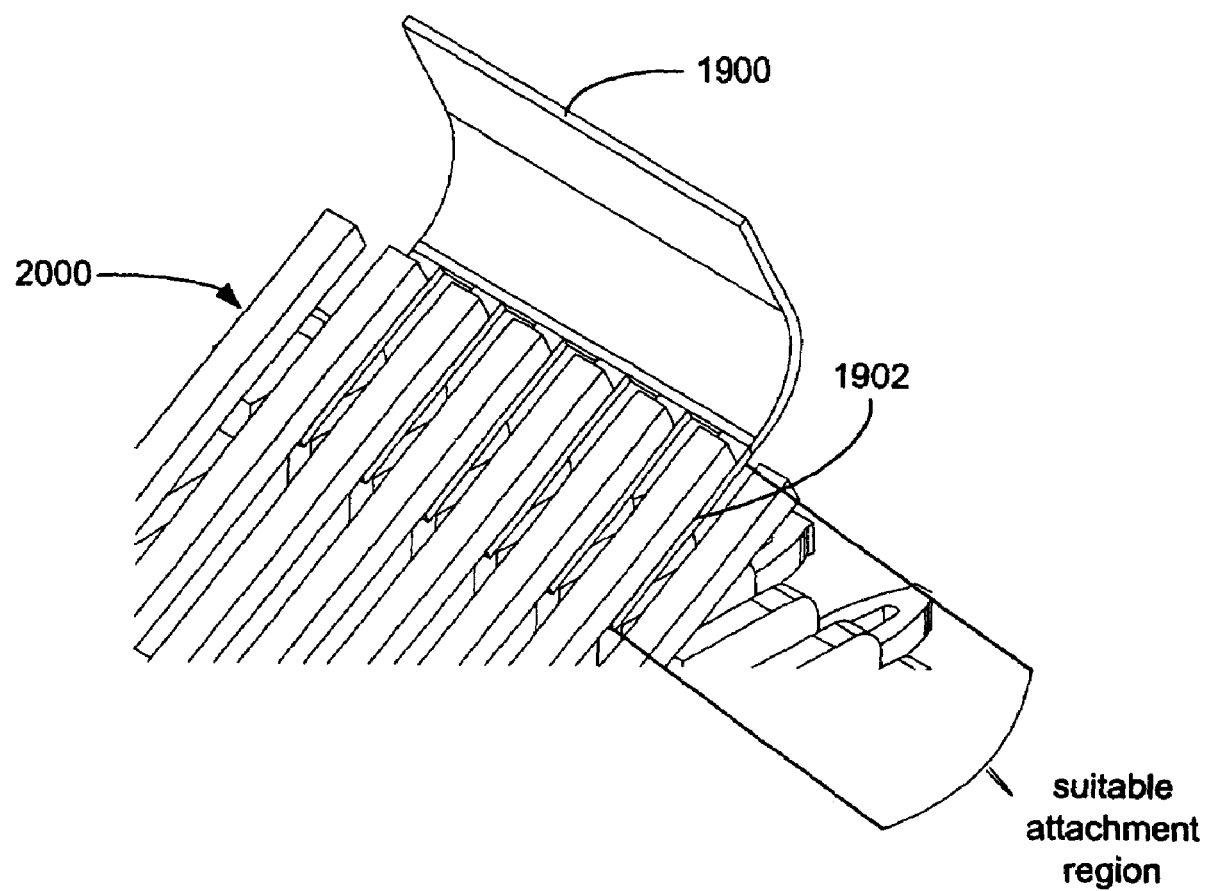
FIG. 22 is a partial upper right-side perspective view illustrating an upward-folded flexible PCB attached to plug interface contacts in accordance with an embodiment of the invention.

FIGS. 21 and 22 are perspective illustrations showing that the flexible PCB 1900 may be folded upward or downward. Other orientations and configurations are also possible. FIG. 22 also shows a suitable region of the plug interface contacts 2000 for attaching the fingers 1902 to the plug interface contacts 2000. Depending on the number of fingers 1902, the flexible PCB 1900 will be attached to the appropriate contacts for tuning.

Figure 23:
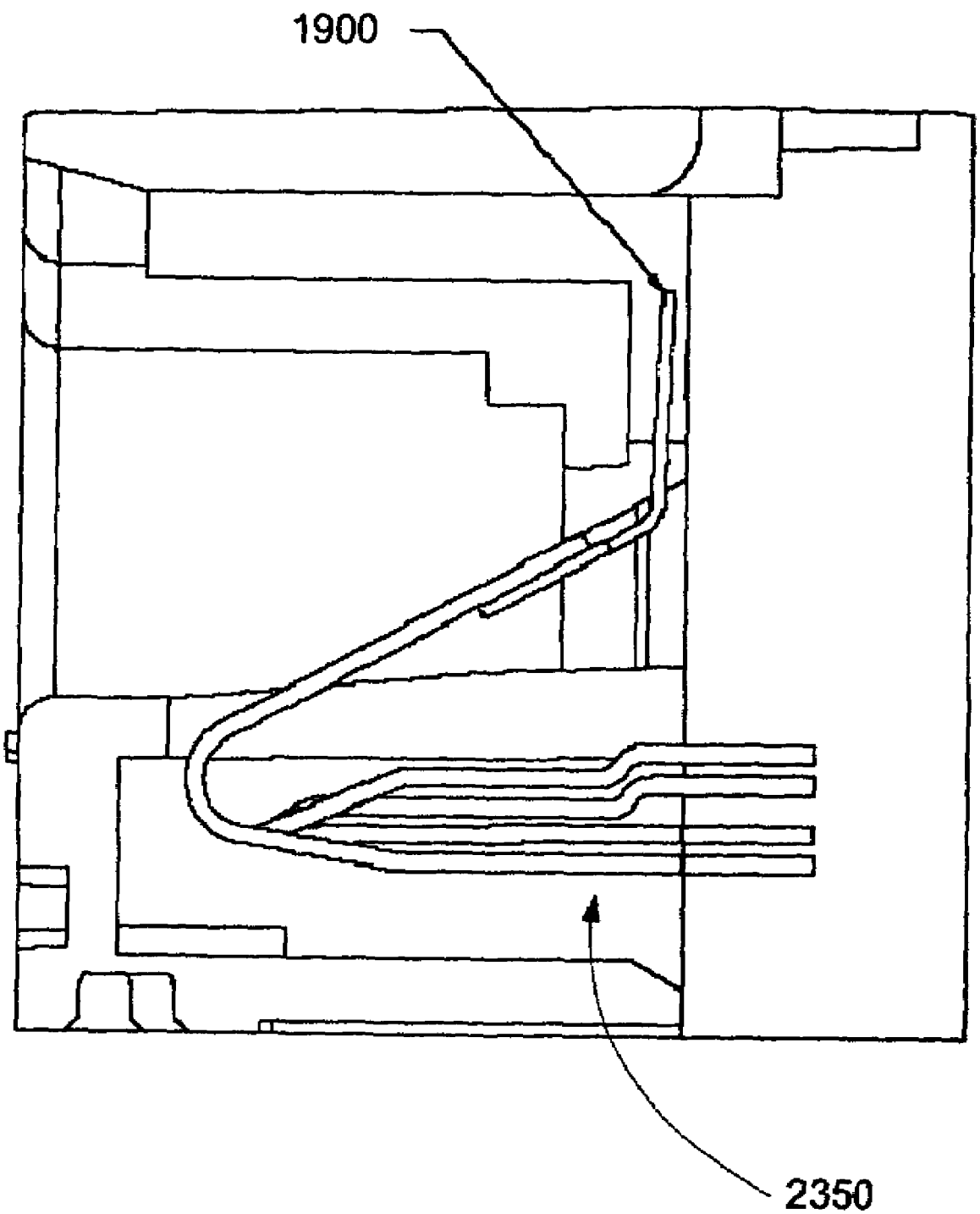
FIG. 23 is a simplified right-side cross-sectional view of a portion of a communications connector showing arrangement of an upward-folded flexible PCB.
Figure 24:
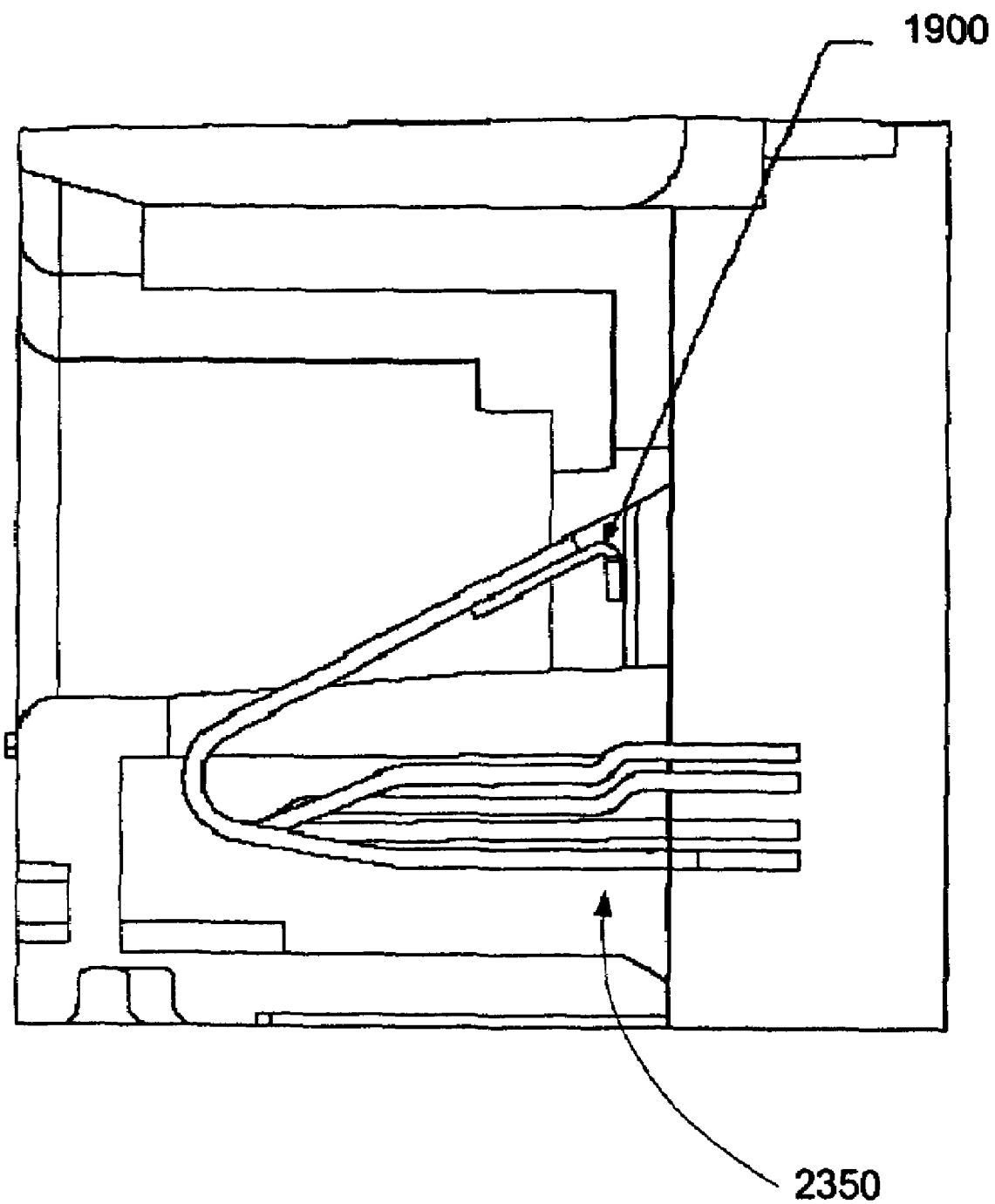
FIG. 24 is a simplified right-side cross-sectional view of a portion of a communications connector showing arrangement of a downward-folded flexible PCB.

FIGS. 23 and 24 are simplified right-side cross-sectional views illustrating that the flexible PCB 1900 may experience deflection upward (FIG. 23) or downward (FIG. 24) in the jack as the plug interface contacts travel in response to insertion of a plug. As the plug is inserted into the jack, the flexible PCB 1900 follows the free deflection of each contact regardless of whether or not it is attached to the flexible PCB 1900. The fingers of the flexible PCB 1900 also accommodate the natural variation in contact deflection due to variation in the plug contact termination height. Clearance may need to be built into the housing for the upward-deflecting flexible PCB 1900 of FIG. 23 or into the front top sled for the downward-deflecting flexible PCB 1900 of FIG. 24. Note that the vertically-spaced layout of plug interface contacts 2350 shown in FIGS. 23 and 24 advantageously provides additional inductive crosstalk compensation. While this layout is preferred, other layouts may alternatively be used.

Figure 24A:
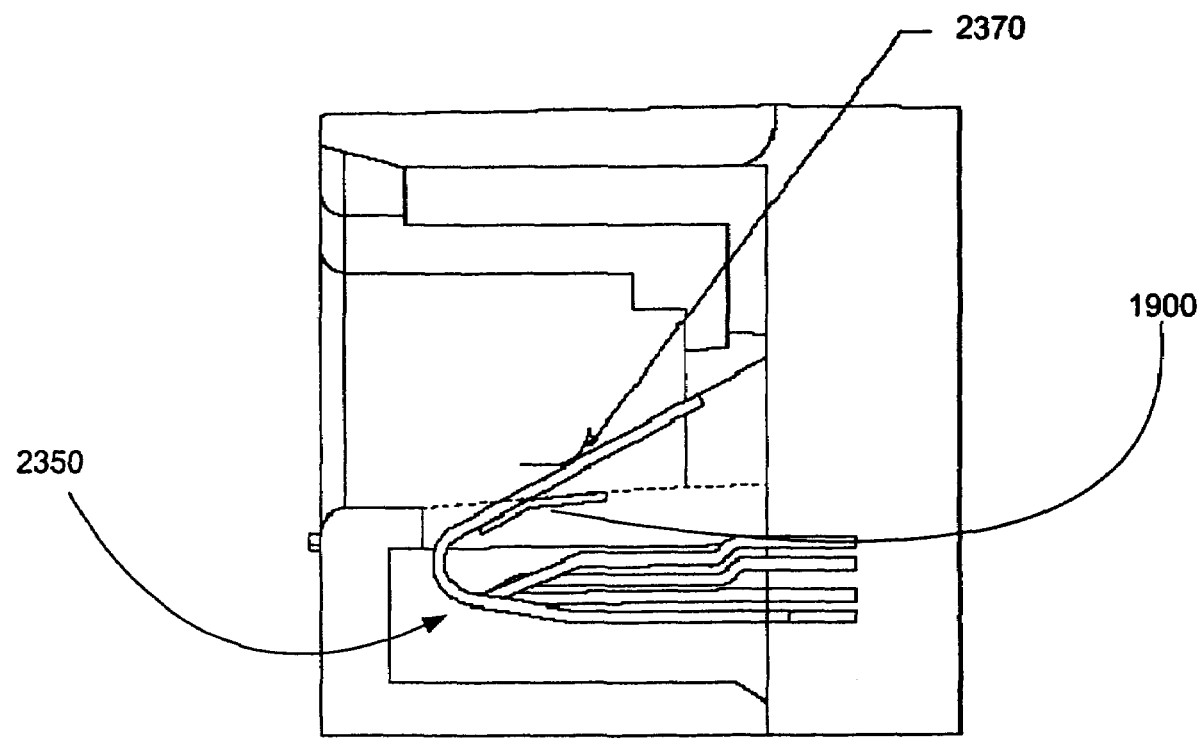
FIG. 24A is a simplified right-side cross-sectional view of a portion of a communications connector showing an alternative arrangement of a flexible PCB.

FIG. 24A is a simplified right-side cross-sectional view illustrating an alternative placement of the flexible PCB 1900 on the plug interface contacts 2350. In this alternative placement, which may, for example utilize the design shown in FIG. 14C, the flexible PCB 1900 and plug (not shown) are on opposite sides of the plug interface contacts 2350. This allows the couplings on the flexible PCB 1900 to be very close to the plug contact point 2370, resulting in reduced propagation delay and thus, reduced phase shift. This, in turn, provides better crosstalk performance. To allow for deflection of the plug interface contacts 2350 when a plug is inserted, the flexible PCB 1900 may be designed to avoid contact with other parts of the jack, such as the lower part of the plug interface contacts 2350.

Figure 25A:
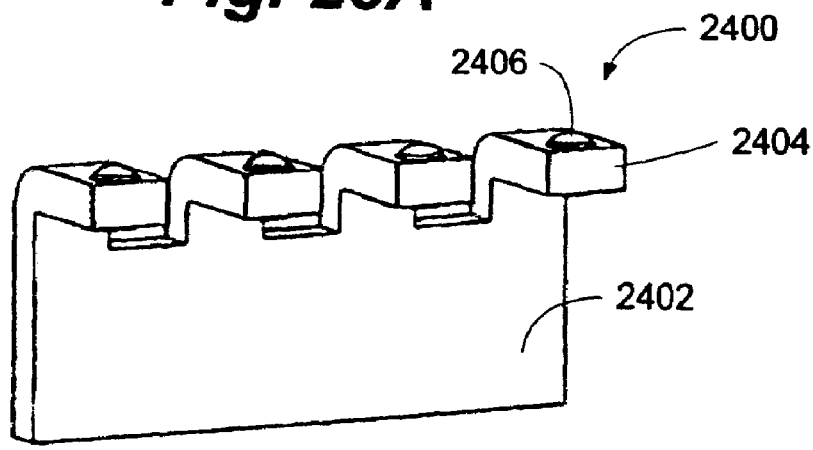
FIG. 25A is an upper right-side perspective view of one embodiment of a flexible PCB that may be utilized in accordance with the present invention.
Figure 25B:
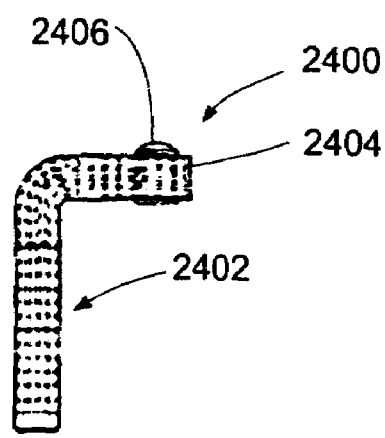
FIG. 25B is a side view of one embodiment of a flexible PCB that may be utilized in accordance with the present invention.
Figure 25C:
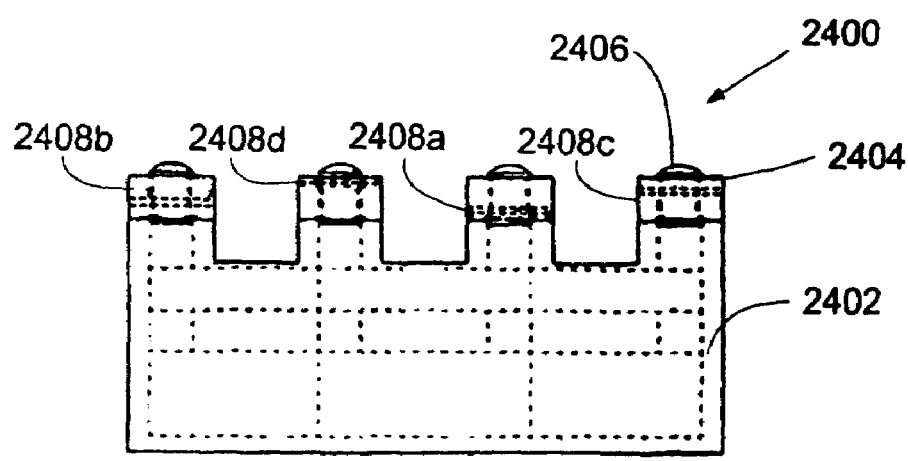
FIG. 25C is a front elevational view of one embodiment of a flexible PCB that may be utilized in accordance with the present invention.

FIG. 25A is an upper right-side perspective view, FIG. 25B is a side view, and FIG. 25C is a front elevational view of one embodiment of a flexible PCB 2400 that may be utilized in accordance with the present invention to provide crosstalk compensation. The PCB 2400 includes a main portion 2402 and attachment fingers, such as the finger 2404. The main portion 2402 supports a plurality of capacitive plates (in this case, four plates, corresponding to plug interface contacts 3-6) to provide capacitive coupling. As will be illustrated in FIGS. 25D-I, the leads to the capacitive plates provide an inductive coupling component as well. The fingers 2404 serve as an attachment mechanism for attaching the PCB 2400 to the plug interface contacts, using one of the schemes shown in FIGS. 23-24A, for example. While any suitable attachment technique may be used, in the illustrated embodiment, a resistance weld rivet 2406 is used. In addition to attaching the PCB 2400 to the plug interface contacts (or another conductor connected to the plug interface contacts), the rivet 2406 acts as a contact post for the capacitive plates and their leads. This is illustrated in FIGS. 25B-I, which show four layers of capacitive plates 2412 and leads (2408a-d), through which the rivet 2406 protrudes to make appropriate contact in the fingers 2404.

Figure 25D:
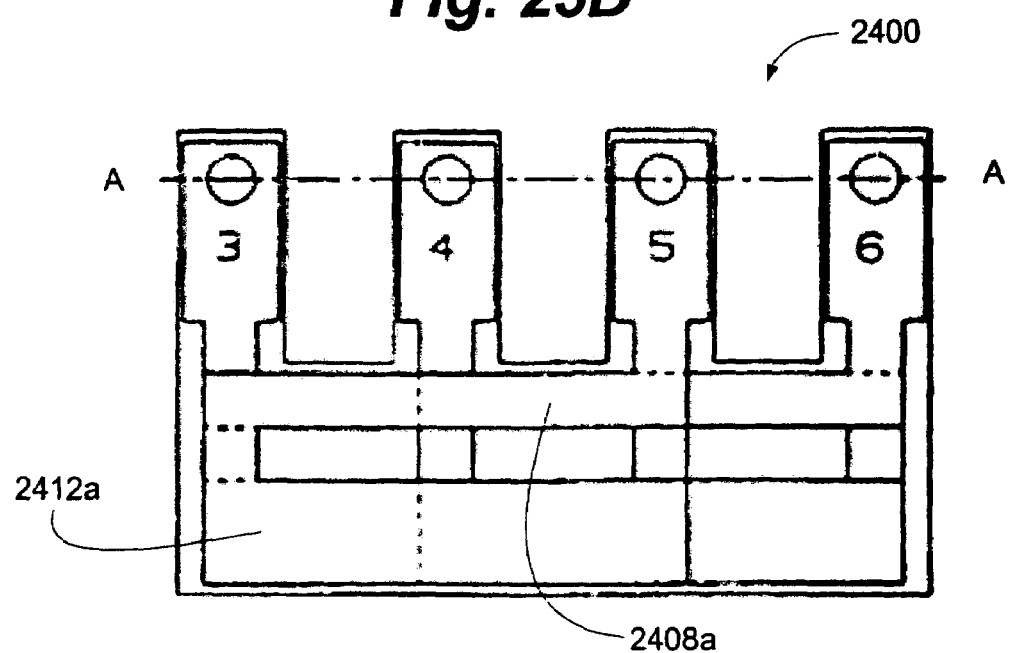
FIG. 25D is a front elevational view of a flexible PCB with the fingers in an unbent configuration, for ease of illustration, in accordance with an embodiment of the present invention.
Figure 25E:
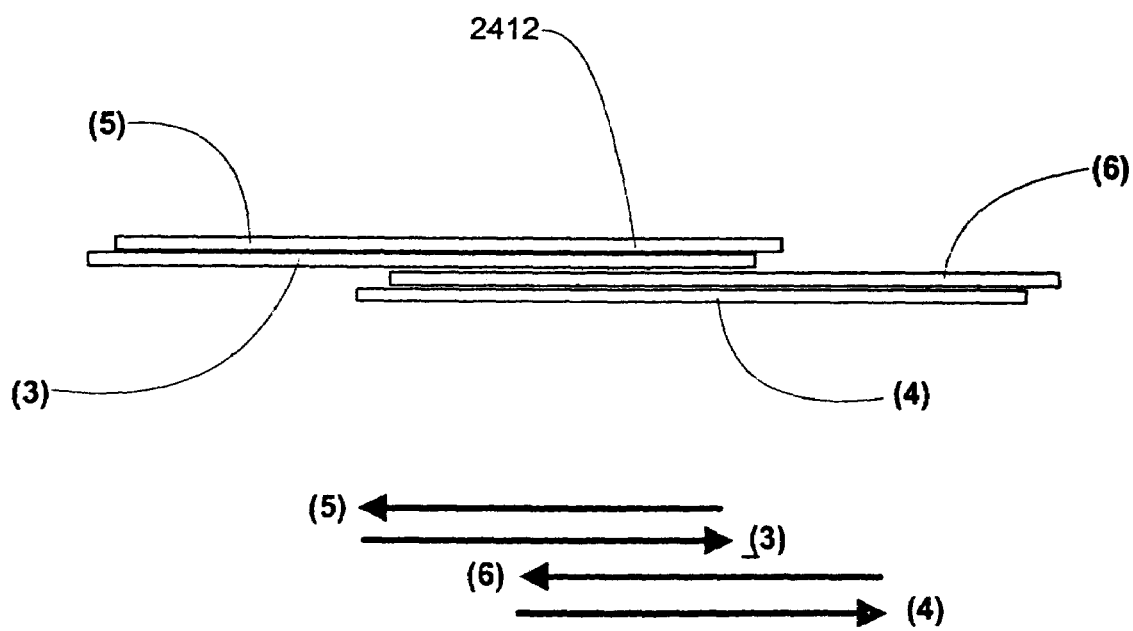
FIG. 25E is a cross-sectional view of the capacitive plates and leads in a flexible PCB in accordance with an embodiment of the present invention.
Figure 25F:
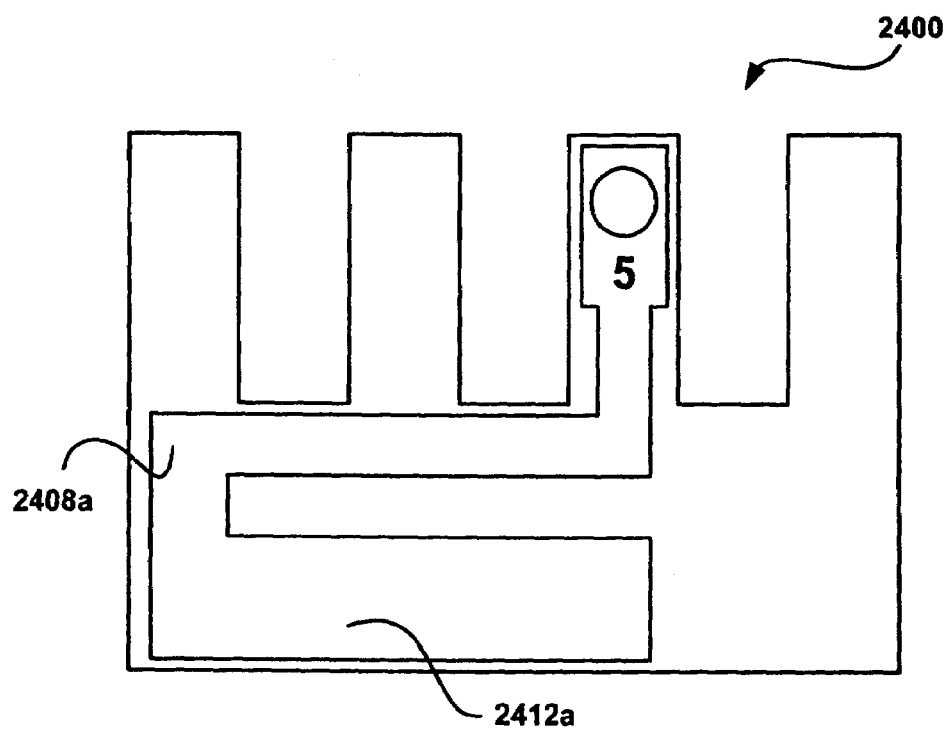
FIG. 25F is a front view of a first lead and capacitive plate in a flexible PCB with the fingers in an unbent configuration, in accordance with an embodiment of the present invention.
Figure 25G:
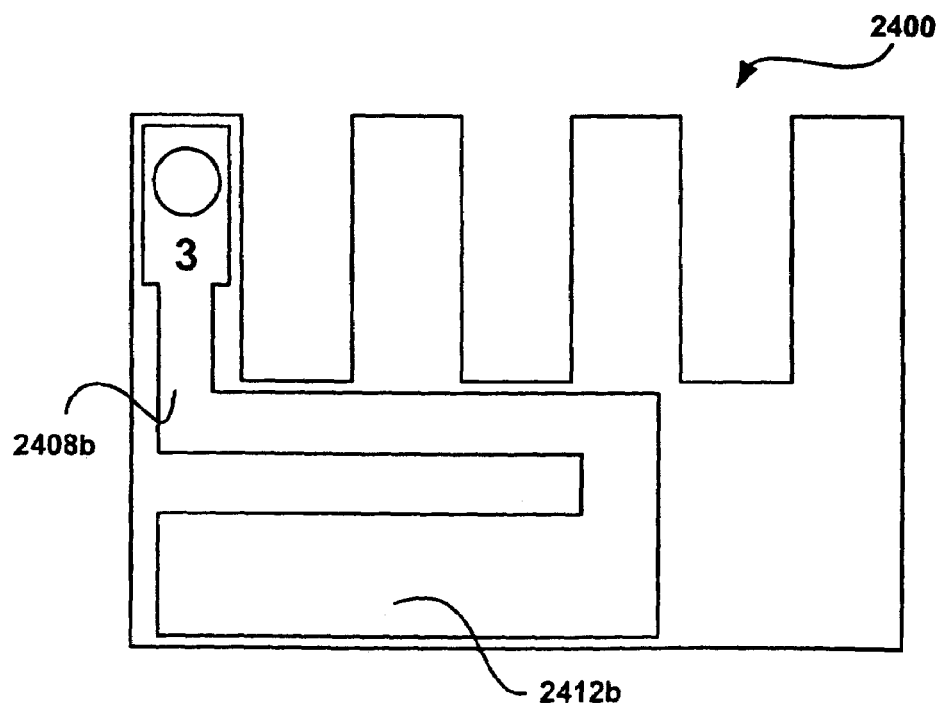
FIG. 25G is a front view of a second lead and capacitive plate in a flexible PCB with the fingers in an unbent configuration, in accordance with an embodiment of the present invention.
Figure 25H:
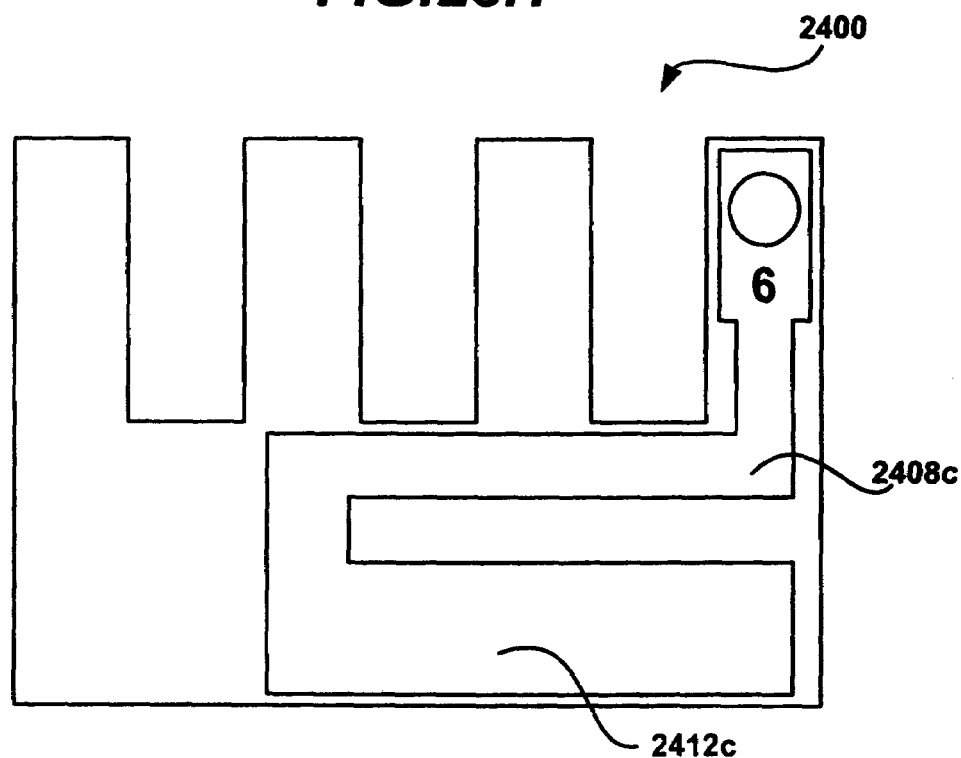
FIG. 25H is a front view of a third lead and capacitive plate in a flexible PCB with the fingers in an unbent configuration, in accordance with an embodiment of the present invention.
Figure 25I:
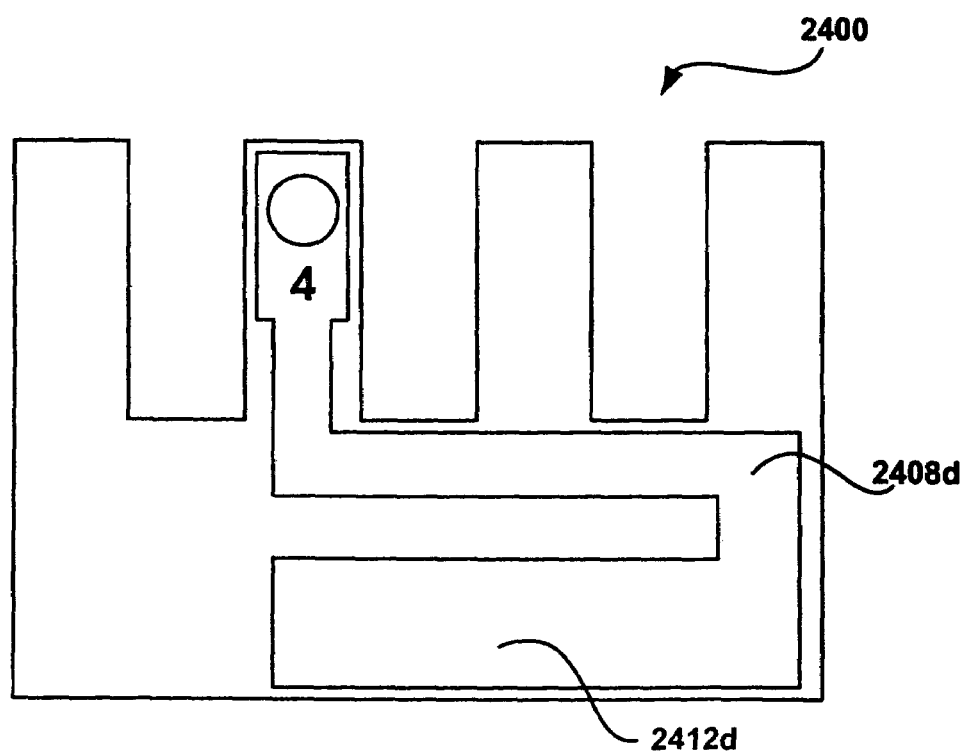
FIG. 25I is a front view of a fourth lead and capacitive plate in a flexible PCB with the fingers in an unbent configuration, in accordance with an embodiment of the present invention.

FIG. 25D is a front elevational view of the PCB 2400 with the fingers in an unbent configuration, for ease of illustration. FIG. 25E is a cross-sectional view of the capacitive plates and leads as viewed upward from the bottom of the PCB 2400 toward line A/A in FIG. 25D. Note that FIG. 25E does not show portions of the PCB 2400 that merely support the capacitive plates and leads or serve as a dielectric or insulator. FIGS. 25D-I show how the capacitive plates and leads are placed with respect to one another to result in a relatively high density of inductive coupling in a relatively short distance. For example, in FIG. 25D, the capacitive plate 2412a and lead 2408a for conductor 5 is the topmost plate and lead shown, having a sideways "U" shape. The same "U" shape, but with varying orientation, is used for conductors 3, 4, and 6, as shown by the dashed and solid lines of FIG. 25D. The physical placement and overlapping area of the capacitive plates determines the amount of capacitive coupling. Similarly, the separation of the leads from one another and the length of overlap determine the amount of inductive coupling. FIG. 25E also illustrates the relative direction of current flow in the respective leads, which provides a high density of inductive coupling. FIGS. 25F-25I show, respectively, leads 2408a-d and capacitive plates 2412a-d associated with, respectively, fifth, third, sixth, and fourth conductors of an eight-conductor jack.

Figure 26:
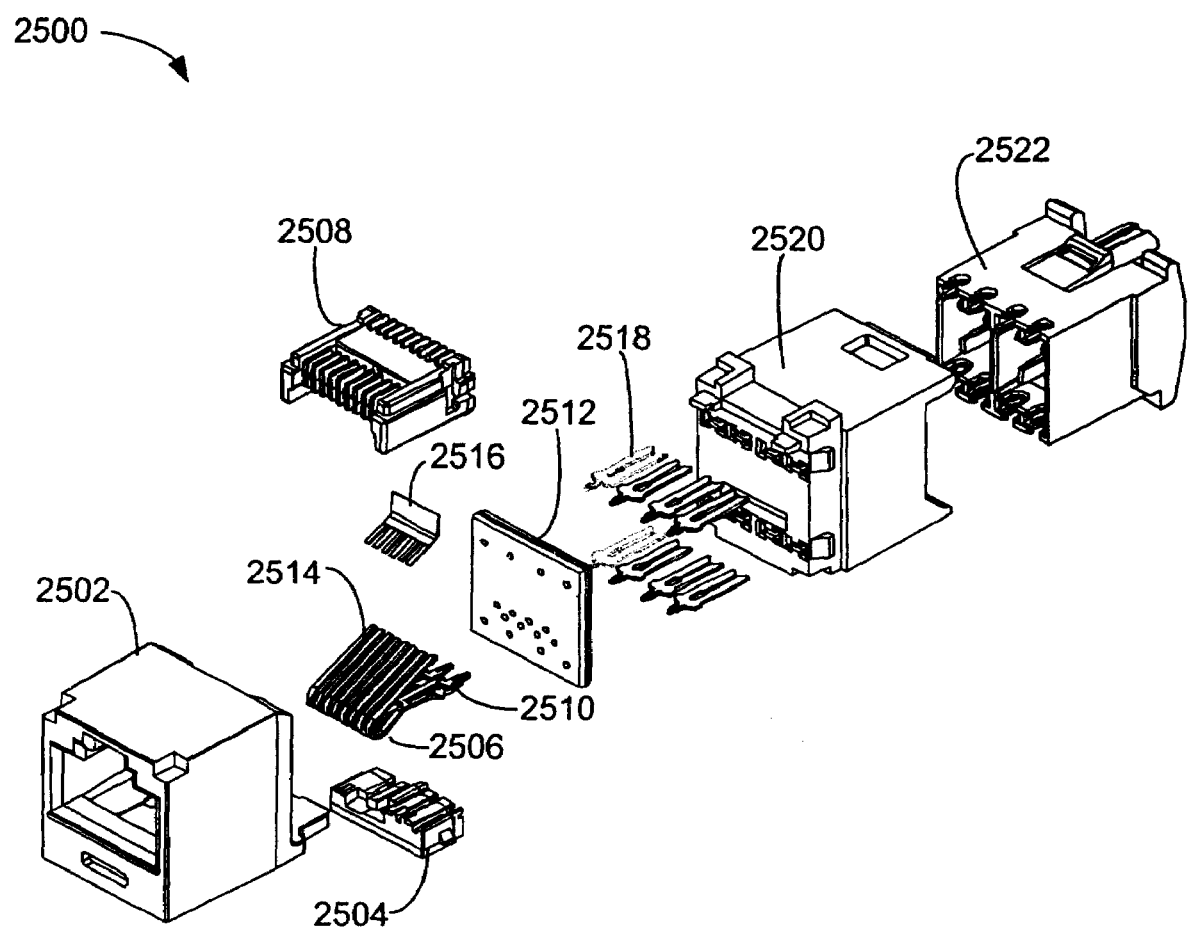
FIG. 26 is an upper right-side exploded perspective view of a connector jack employing a flexible PCB in accordance with an embodiment of the invention.

FIG. 26 is an upper right-side exploded perspective view of a connector jack 2500 employing the flexible PCB concept. The jack 2500 includes a bottom front sled 2504 and a top front sled 2508, each mechanically attached to a plurality of plug interface contacts 2506. A first end 2510 of the plug interface contacts 2506 may be inserted into through-holes in an interface PCB 2512, while a second end 2514 is attached to a flexible PCB 2516 that provides crosstalk compensation. The sub-assembly comprising the bottom front sled 2504, plug interface contacts 2506, top front sled 2508, interface PCB 2512, and flexible PCB 2516 is then inserted into a housing 2502. Also to be inserted into through-holes on the interface PCB 2512 are a plurality of IDCs 2518. A rear sled 2520 is snapped into the housing 2502. A wire containment cap 2522 is configured to accept a four-pair twisted-pair communication cable (not shown) for connection to the IDCs 2518 through the rear sled 2520. The wire containment cap 2522 may then be snapped onto the rear sled 2520, forming an integrated communication jack assembly.

While FIGS. 19-26 are described with reference to a flexible PCB, this is merely one embodiment, and other embodiment using rigid PCBs or other compensation schemes may also be possible without departing from the intended scope of the invention. A flexible PCB may assist in meeting mechanical constraints that may exist in some connector designs.

Another technique for shortening the distance between the crosstalk compensation zone and the interface between the plug and plug interface contacts will now be described with reference to FIGS. 27-29. In this third technique, a back-rotated plug interface contact design is used in conjunction with an underlying compensation PCB to provide crosstalk compensation extremely close to the interface between the plug and plug interface contacts. As a result, propagation delays are minimized, as is the phase shift of the crosstalk compensation. This simplifies the overall compensation scheme by reducing the number of zones of crosstalk and compensation, which allows for better operation at high frequencies.

Figure 27:
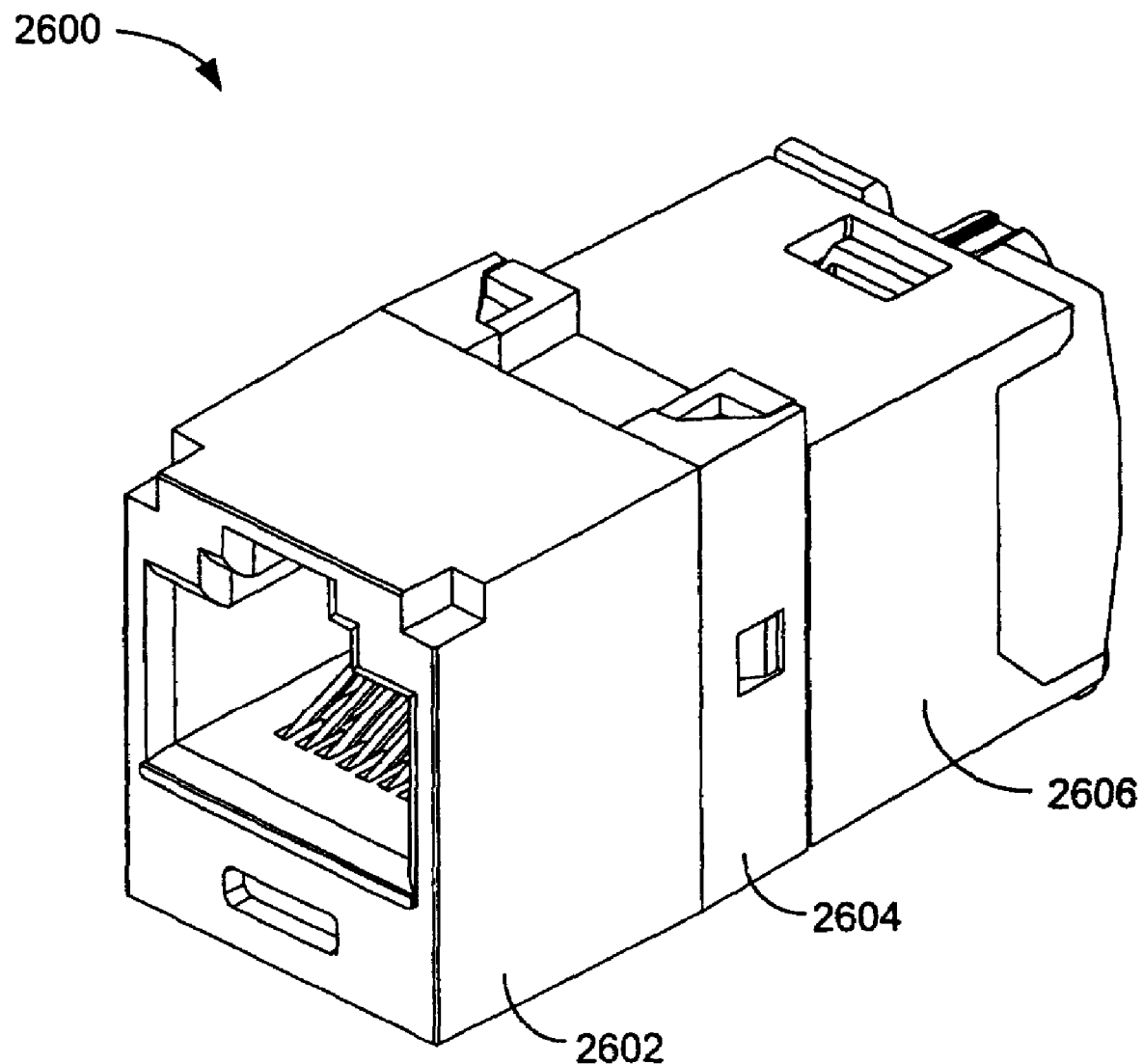
FIG. 27 is an upper right-side perspective view of an assembled jack in accordance with an embodiment of the invention.

FIG. 27 is an upper right-side perspective view of an assembled jack 2600. The jack 2600 includes a housing 2602 designed to accept a plug (not shown), a rear sled 2604, and a wire containment cap 2606 configured to accept a communication cable (not shown). The housing 2602, rear sled 2604, and wire containment cap 2606 latch together to form the assembled jack 2600.

Figure 28:
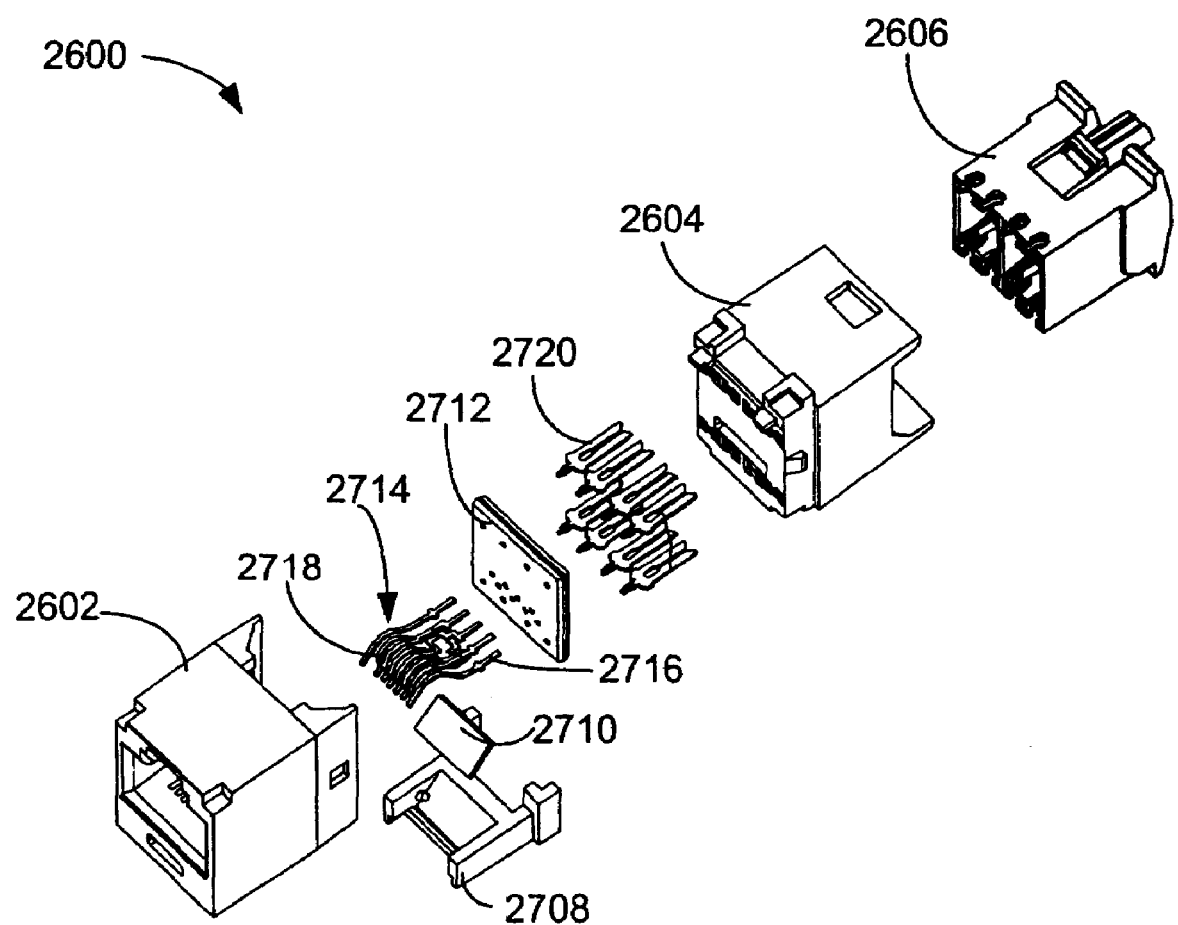
FIG. 28 is an upper right-side perspective exploded view of a jack in accordance with an embodiment of the invention.

FIG. 28 is an upper right-side perspective exploded view of the jack 2600. In addition to the housing 2602, rear sled 2604, and wire containment cap 2606 described with reference to FIG. 27, the jack 2600 includes a PCB support 2708 designed to support a compensation PCB 2710 and an interface PCB 2712. A plurality of plug interface contacts 2714 have first ends 2716 pressed into through-holes in the interface PCB 2712 and second ends 2718, at least some of which slide along the compensation PCB 2710 as a plug is received into the jack 2600. A plurality of IDCs 2720 are inserted in through-holes in the interface PCB 2712. FIG. 29 shows a closer perspective view of this plug interface contact subassembly (with the exception of IDCs 2720), which is inserted into the housing 2602, prior to the rear sled 2604 being snapped onto the housing 2602. Assembly of the jack 2600 further includes positioning and installing a communication cable in the wire containment cap 2606, which is then snapped onto the rear sled 2604.

Figure 29:
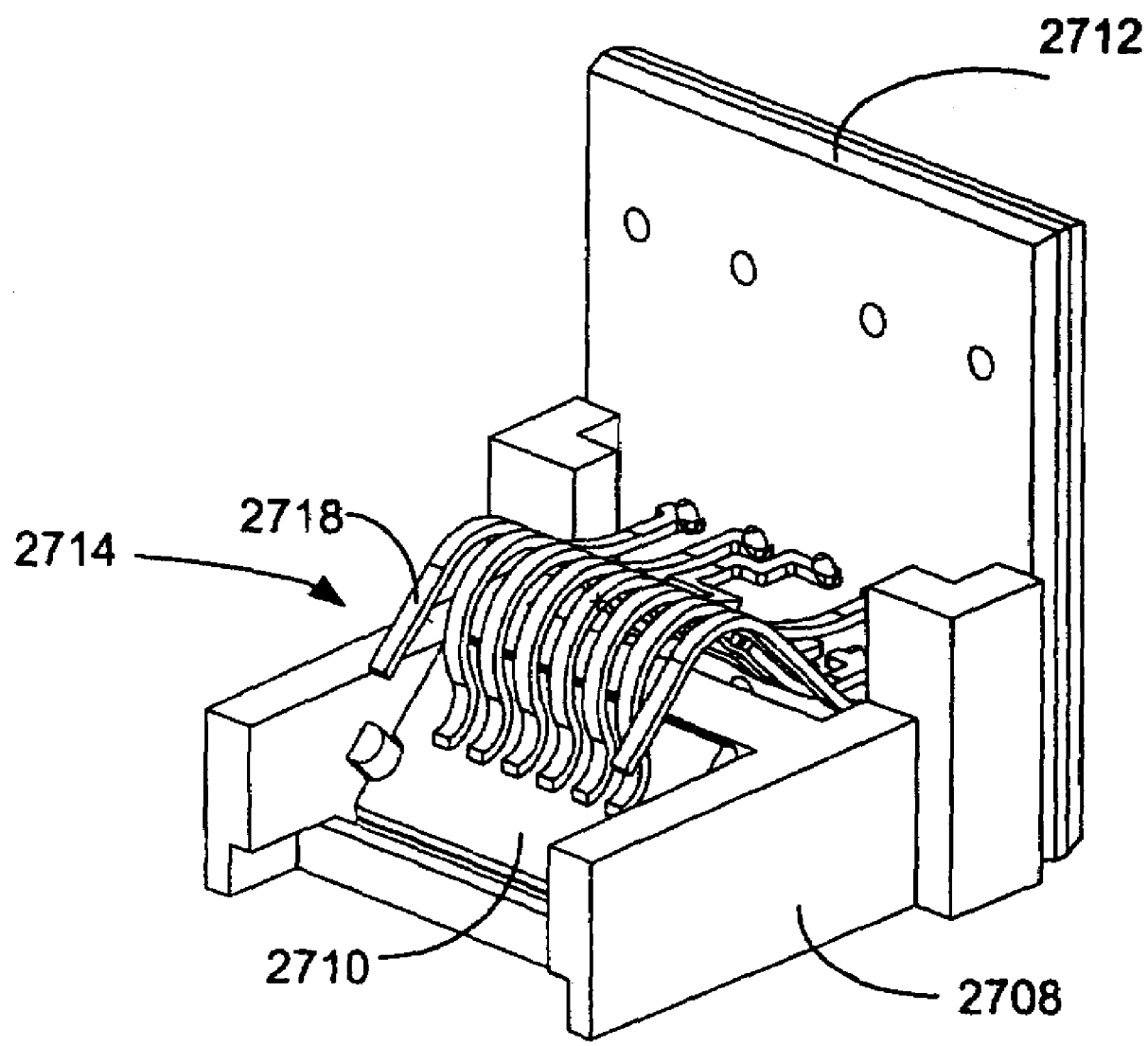
FIG. 29 is an upper right-side perspective view of a plug interface contact sub-assembly and PCB designed to accommodate 8-position plugs or 6-position plugs.

The plug interface contact sub-assembly (without IDCs 2720) shown in FIG. 29 is designed to accommodate either 8-position plugs or 6-position plugs. When an 8-position plug is inserted into the jack, a downward force causes contacts 2 through 7 to slide along the compensation PCB 2710. Contacts 1 and 8 deflect, but don't slide along the compensation PCB 2710. In contrast, when a 6-position plug is inserted into the jack, contacts 2 through 7 still slide along the compensation PCB 2710. However, contacts 1 and 8 deflect more than contacts 2 through 7, due to additional plastic material on the 6-position plug. The clearance over the compensation PCB 2710 provided by plug interface contacts 1 and 8 allows for this additional deflection, while maintaining adequate normal force between the plug and plug interface contacts 2714.

Inductance Enhancement for Compensation Circuits

The compensation circuits described above with reference to FIGS. 11A-14C may be realized using standard layout and processing techniques composed of well-known electrical components. Additionally, generating mutual inductance circuits with substantial inductive properties to act as these compensators is relatively simple, when limits are not placed on the trace length of the circuit. However, the limited space provided by the PCB board attached to the plug interface contacts within the jack housing requires novel processing techniques and devices in order to create optimal inductive properties in as short of a trace as possible. These techniques should allow phase delay to be effectively introduced into the compensation circuitry despite the shortened trace lengths required of limited PCB area.

Figure 30:
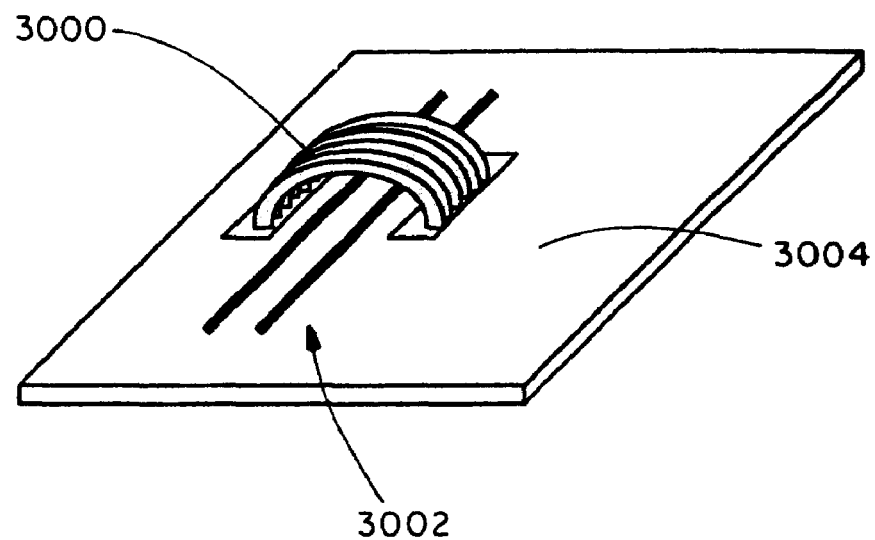
FIG. 30 is simplified pictorial representation of an attachment of a ferrite material structure that serves as an inductor.

One technique is to use magnetic ferrite materials to increase the mutual inductance between two signal traces. The magnetic material reacts strongly to the movement of electrical charges in a first signal trace, which also generate a magnetic flux. This magnetic flux is exhibited in the orientation of magnetic poles with the magnetic material, which then influences the moving electrical charges associated with a second electrical trace. Essentially, the magnetic material acts as a medium by which the two signal traces can be magnetoelectrically coupled to a degree determined by the geometry and magnetic properties of the ferrous or magnetic material used. FIG. 30 shows an attachment of a ferrite material structure 3000 that serves as external inductor element for the two signal traces 3002 running through it. The core structure may be in the shape of several arches with the traces passing below the structure. Alternatively, the structure may have a solid half-cylindrical shape, or may be in the form of several rectangular arches. The external magnetic core may be composed of powdered iron, iron, nickel, steel, or a composite of these metals. Alternatively, it may be composed of another magnetic ferrite material with magneto-electric inductive properties. The magnetic core may be fabricated separately from the board, and may be soldered, glued, or snapped into place at pre-fabricated sites on the PCB 3004. Attaching this component may be performed at a different site than that of the PCB manufacturer after PCB processing has been completed.

Figure 31:
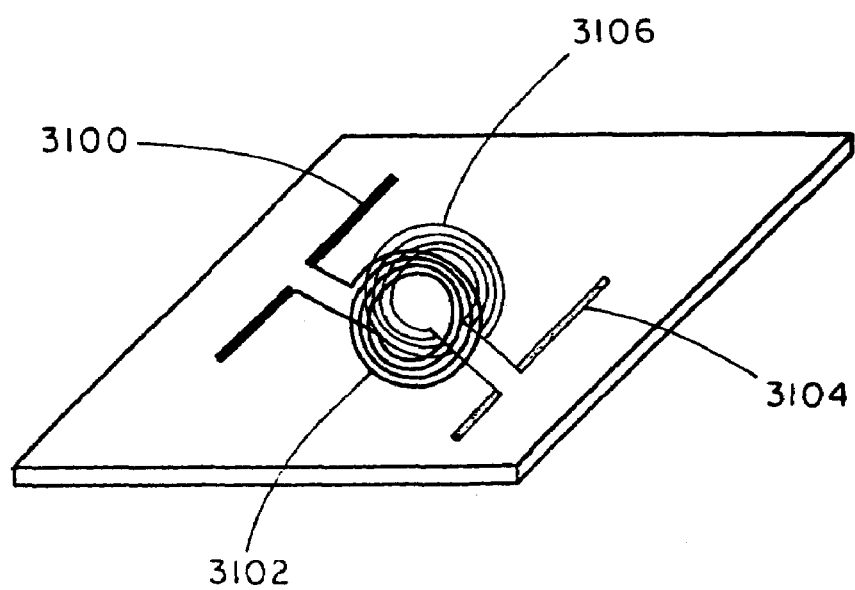
FIG. 31 is simplified pictorial representation of two traces altered to increase coupling.

FIG. 31 shows another method that can be used to increase mutual inductance between signal traces. In the method shown, no external components are required to generate the inductive coupling between the traces. Rather, the geometry of the traces themselves is altered to maximize coupling between the two signals. In this example, one trace 3100 is formed into a first winding 3102, while the second trace 3104 is formed into a second winding 3106. The two windings overlap by a specified amount and geometry, allowing for an increased interaction between the two traces per trace length. Alternatively, different trace geometries may be used in order to increase the inductive coupling between the signals, such as elliptical or rectangular spirals.

Figure 32:
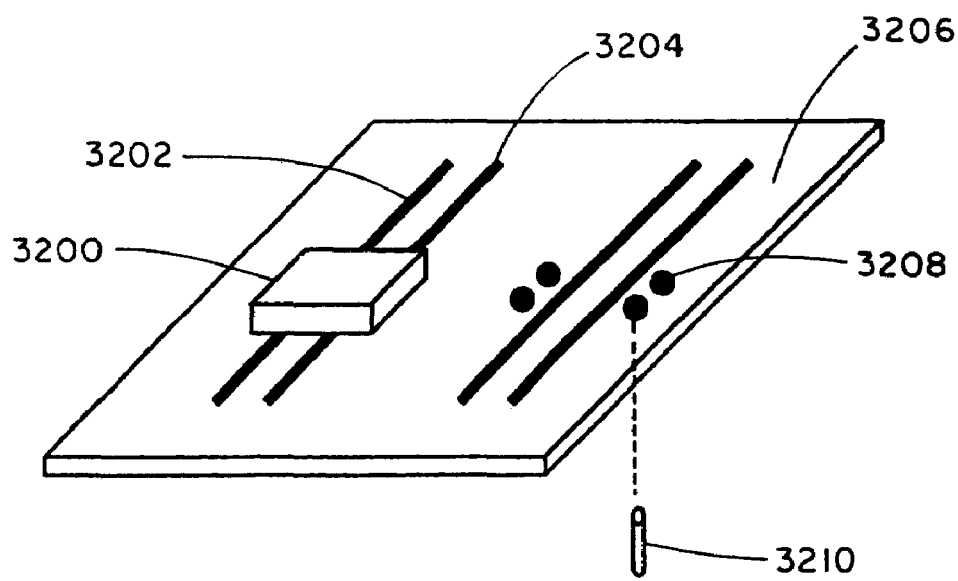
FIG. 32 is simplified pictorial representation of two sets of traces, one utilizing a magnetic coupler and the other utilizing magnetic material placed in through-holes.

FIG. 32 illustrates two similar methods that may be used to increase the mutual inductance between signal traces. Like the first method presented, the methods shown in FIG. 32 utilize magnetic core materials to increase the inductive coupling between two signal traces. In one method, the coupling is achieved by placing a magnetic coupler 3200 directly over two parallel traces 3202 and 3204. The magnetic material may be applied to the surface of the board 3206 using a variety of techniques. For example, the material may be melted and deposited onto the surface using a drop dispenser, it may be screened on, it may be added using an immersion and etch process, it may be rolled on, or the magnetic materials may be added using a similar process that allows for the patterned and localized deposition of material onto the surface of the circuit board.

In another method shown in FIG. 32, the magnetic coupling material may be inserted into the PCB 3206 through fabricated holes 3208 in the board. The holes 3208 may then be filled with magnetic material 3210 using, for example, a screening process. Alternatively, the magnetic material 3210 may be press fit into the PCB. The holes 3208 may be circular with cylindrical magnetic plugs used to fill the vacancies. Alternatively, the holes may consist of a different geometry that allows for inductive coupling between the traces through the magnetic core material.

In both embodiments shown in FIG. 32, the magnetic material 3210 may be any magnetic ferrite material, such as those described above. Additionally, the magnetic components may ideally be incorporated into the PCB manufacturing process.

However, the addition of the magnetic couplers may also take place after the board has been created at a different site from the PCB manufacturer.

Figure 33:
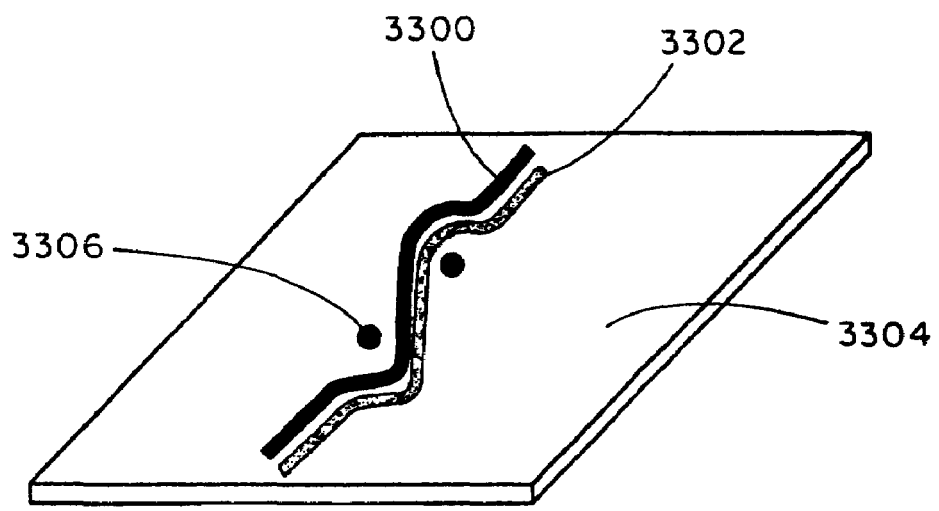
FIG. 33 is simplified pictorial representation of two parallel traces on separate layers of a PCB.

FIG. 33 illustrates a similar method to the embodiments shown in FIG. 32. However, in this embodiment, the two signal traces 3300 and 3302 are located in parallel on separate layers within the PCB 3304. Holes 3306 are drilled into the PCB 3304 next to the signal traces 3300 and 3302 and are then filled with magnetic material. The signal traces 3300 and 3302 may be laid out so that they wrap around the magnetic cores, thereby increasing the amount of coupling induced by the magnetic material. Alternatively, other layouts may be used that either increase or decrease the amount of coupling, as required by the electrical specifications of the circuit. Filling the holes 3306 with magnetic core material may be accomplished via a screening process. The creation of the PCB holes 3306 and subsequent filling with magnetic material may be accomplished during the PCB manufacturing process, although such processing may also take place following the creation of the board and at a different site from the PCB manufacturer.

Figure 34:
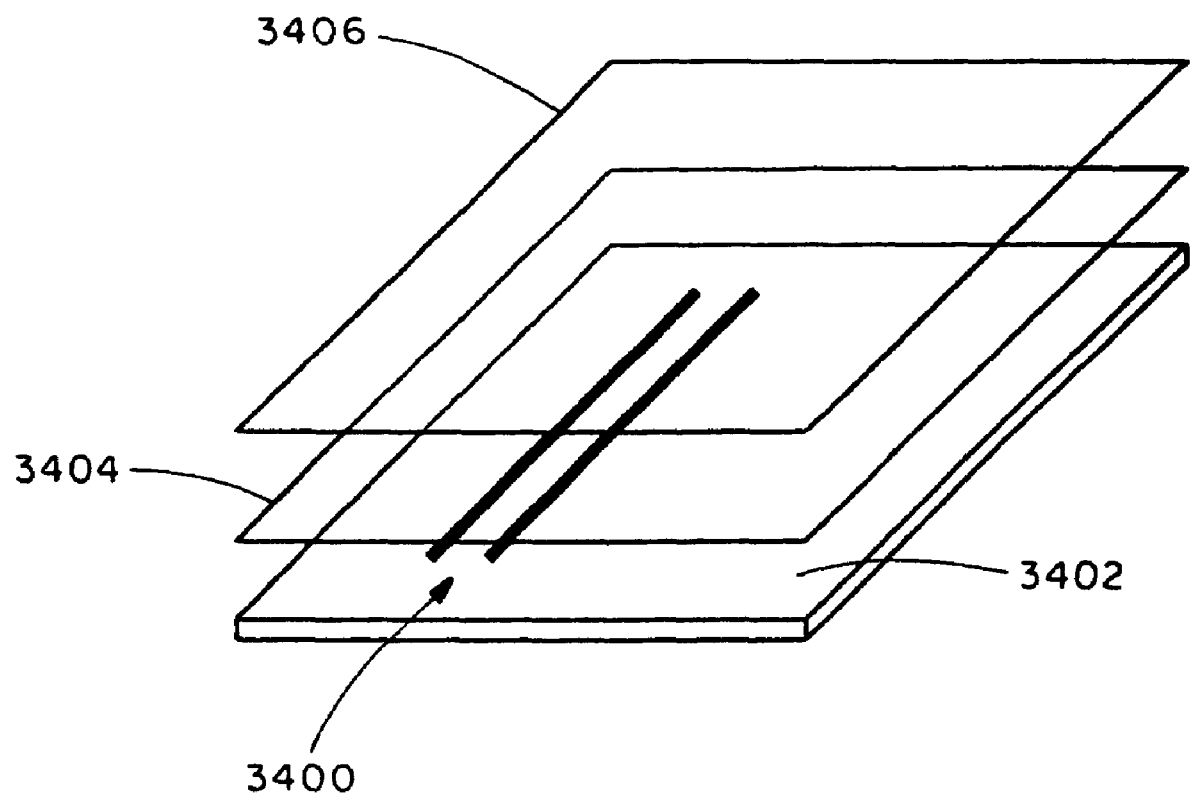
FIG. 34 is simplified pictorial representation of traces on a PCB with an overlay of magnetic material.

Another method for increasing the mutual inductance between signal traces is illustrated in FIG. 34. In this method, the signal traces 3400 are fabricated onto PCB 3402 in the normal fashion. After the traces are created, an internal layer 3404 of magnetic core material is laid on top of the board followed by another capping layer of PCB material 3406. As a result, a layer of magnetic material may be embedded within the circuit board. Alternatively, the internal layer 3404 of magnetic core material may be patterned and selectively removed prior to the application of the capping PCB layer 3406. This would allow the magnetic material to be present only in specific areas where increased inductive coupling is desired, and would also prevent inadvertent coupling between unrelated signal traces. The creation of this type of circuit would need to be performed at the PCB manufacturer site and may require additional processing steps to incorporate the magnetic material into the board.

All of the above methods may be used to increase the inductive coupling per trace length in PCB manufactured circuits. These methods help to realize the crosstalk compensation circuits necessary for mitigating propagation delay effects at high frequencies in modular communication jacks.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the spirit and scope of the present invention. Although specific terms are employed herein, they are used in a generic and descriptive sense only and not for purposes of limitation.

We claim:

1. An electrical connector that includes one or more printed circuit boards, the one or more printed circuit boards comprising:
   a plurality of conductive traces;
   a first compensation structure which includes an inductor-capacitor combination providing a first crosstalk compensation signal having a first magnitude to a first of the plurality of conductive traces wherein the inductor-capacitor combination is formed by overlapping trace leads and capacitor plates; and
   a second compensation structure providing a second crosstalk compensation signal having a second magnitude to the first of the plurality of conductive traces,
   wherein a ratio of the first magnitude to the second magnitude varies with frequency.

2. The electrical connector of claim 1, wherein the inductor-capacitor combination comprises mutual inductance formed by overlapping trace leads.

3. The electrical connector of claim 2, wherein electrical currents flowing through two conductors which provide the mutual inductive coupling flow in opposite directions.

4. The electrical connector of claim 2, wherein the plurality of conductive traces comprises first, second, third and fourth conductive traces with the first and second traces being associated with a first differential circuit pair of the connector and the third and fourth traces being associated with a second differential circuit pair of the connector.

5. The electrical connector of claim 4, wherein the second and third traces overlap each other such that they provide mutual inductive and capacitive coupling between each other and the first and fourth traces overlap such that they provide mutual inductive and capacitive coupling between each other.

6. The electrical connector of claim 5, wherein electrical currents flowing through two conductors which provide the mutual inductive coupling flow in opposite directions.

7. The electrical connector of claim 6, wherein the trace leads and capacitor plates are formed into sideways "U" shapes.

* * * * *